United States Patent
Takemura et al.

(10) Patent No.: US 6,455,875 B2
(45) Date of Patent: Sep. 24, 2002

(54) THIN FILM TRANSISTOR HAVING ENHANCED FIELD MOBILITY

(75) Inventors: Yasuhiko Takemura; Hongyong Zhang; Satoshi Teramoto, all of Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 09/387,054

(22) Filed: Aug. 31, 1999

Related U.S. Application Data

(62) Division of application No. 08/886,138, filed on Jun. 30, 1997, which is a continuation of application No. 08/645,695, filed on May 14, 1996, now abandoned, which is a continuation of application No. 08/378,316, filed on Jan. 25, 1995, now abandoned, which is a continuation of application No. 08/131,958, filed on Oct. 8, 1993, now abandoned.

(30) Foreign Application Priority Data

| Oct. 9, 1992 | (JP) | 4-297650 |
| Jun. 18, 1993 | (JP) | 5-172711 |
| Jul. 20, 1993 | (JP) | 5-200253 |

(51) Int. Cl.[7] ............ H01L 29/04; H01L 27/01
(52) U.S. Cl. ............ 257/72; 257/66; 257/347; 438/151; 438/216; 438/261
(58) Field of Search .............. 257/288, 368, 257/388, 412, 751, 72, 66, 347, 352, 384; 438/149, 151, 157, 166, 165, 216, 261

(56) References Cited

U.S. PATENT DOCUMENTS

| 3,855,112 A | 12/1974 | Tomozawa et al. | |
| 4,336,550 A | 6/1982 | Medwin | 257/351 |
| 4,378,628 A | 4/1983 | Levinstein et al. | 257/384 |
| 4,468,855 A | 9/1984 | Sasaki | 257/368 |
| 4,554,572 A | 11/1985 | Chatterjee | 257/69 |
| 4,570,328 A | 2/1986 | Price et al. | |
| 4,619,034 A | 10/1986 | Janning | |

(List continued on next page.)

FOREIGN PATENT DOCUMENTS

| EP | 0 486 284 A2 | 5/1992 |
| EP | 502 749 A2 | 9/1992 |
| JP | 54-153583 | 12/1979 |

(List continued on next page.)

OTHER PUBLICATIONS

U.S. Patent Application Publication No. US 2001/0050664A1.

(List continued on next page.)

*Primary Examiner*—Minh Loan Tran
(74) *Attorney, Agent, or Firm*—Nixon Peabody LLP; Jeffrey L. Costellia

(57) ABSTRACT

A thin film transistor device reduced substantially in resistance between the source and the drain regions by incorporating a silicide film, which is fabricated by a process comprising forming a gate insulator film and a gate contact on a silicon substrate, anodically oxidizing the gate contact, covering an exposed surface of the silicon semiconductor with a metal, and irradiating an intense light such as a laser beam to the metal film either from the upper side or from an insulator substrate side to allow the metal coating to react with silicon to obtain a silicide film. The metal silicide layer may be obtained otherwise by tightly adhering a metal coating to the exposed surface of the source and drain regions using an insulator formed into an approximately triangular shape, preferably 1 μm or less in width, and allowing the metal to react with silicon. Accordingly, a high performance TFT is realized since the metal silicide layer achieves favorable contact with the source and drain regions, and, since it has lower resistivity than silicon, the parasitic resistance between the source and drain regions can be considerably lowered.

24 Claims, 13 Drawing Sheets

U.S. PATENT DOCUMENTS

| | | | |
|---|---|---|---|
| 4,646,426 A | 3/1987 | Sasaki | |
| 4,707,721 A | 11/1987 | Ang et al. | |
| 4,746,628 A | 5/1988 | Takafuji et al. | |
| 4,755,478 A | 7/1988 | Abernathey et al. | |
| 4,769,686 A | 9/1988 | Horiuchi et al. | 257/384 |
| 4,899,202 A * | 2/1990 | Blake et al. | 257/72 |
| 4,923,822 A | 5/1990 | Wang et al. | 257/382 |
| 4,925,812 A | 5/1990 | Gould | |
| 4,931,411 A | 6/1990 | Tigelaar et al. | |
| 4,943,837 A | 7/1990 | Konishi et al. | |
| 4,951,100 A | 8/1990 | Parrillo | |
| 4,965,213 A | 10/1990 | Blake | |
| 5,064,775 A | 11/1991 | Chang | |
| 5,083,190 A | 1/1992 | Pfiester | |
| 5,124,769 A | 6/1992 | Tanaka et al. | |
| 5,141,880 A | 8/1992 | Inoue et al. | |
| 5,141,897 A | 8/1992 | Manocha et al. | |
| 5,147,826 A | 9/1992 | Liu et al. | |
| 5,166,086 A | 11/1992 | Takeda et al. | |
| 5,177,577 A | 1/1993 | Taniguchi et al. | |
| 5,227,315 A | 7/1993 | Frisina et al. | |
| 5,240,868 A | 8/1993 | Bae et al. | |
| 5,245,207 A | 9/1993 | Mikoshiba et al. | |
| 5,248,623 A | 9/1993 | Muto et al. | |
| 5,252,502 A | 10/1993 | Havemann | 257/384 |
| 5,266,507 A | 11/1993 | Wu | |
| 5,275,851 A | 1/1994 | Fonash et al. | |
| 5,289,030 A | 2/1994 | Yamazaki et al. | 257/900 |
| 5,294,555 A | 3/1994 | Mano et al. | |
| 5,300,449 A | 4/1994 | Okamura | |
| 5,308,998 A | 5/1994 | Yamazaki et al. | |
| 5,313,077 A | 5/1994 | Yamazaki | |
| RE34,658 E | 7/1994 | Yamazaki et al. | 257/53 |
| 5,341,028 A | 8/1994 | Yamaguchi et al. | 257/382 |
| 5,359,219 A | 10/1994 | Hwang | 257/351 |
| 5,366,912 A | 11/1994 | Kobayashi | |
| 5,470,762 A | 11/1995 | Codama et al. | |
| 5,478,766 A | 12/1995 | Park et al. | |
| 5,498,573 A | 3/1996 | Whetten | |
| 5,528,056 A | 6/1996 | Shimada et al. | |
| 5,576,225 A | 11/1996 | Zhang et al. | |
| 5,576,556 A | 11/1996 | Takemura et al. | 257/66 |
| 5,595,944 A | 1/1997 | Zhang et al. | |
| 5,604,137 A | 2/1997 | Yamazaki et al. | |
| 5,614,732 A | 3/1997 | Yamazaki | |
| 5,646,424 A | 7/1997 | Zhang et al. | |
| 5,656,826 A | 8/1997 | Misawa et al. | 257/72 |
| 5,854,494 A * | 12/1998 | Yamazaki et al. | 257/66 |

FOREIGN PATENT DOCUMENTS

| | | | |
|---|---|---|---|
| JP | 57-99775 | 6/1982 | |
| JP | 58-004180 | 1/1983 | |
| JP | 58-23479 | 2/1983 | |
| JP | 60-245174 | 12/1985 | |
| JP | 61-183971 | 8/1986 | |
| JP | 62-032653 | 2/1987 | |
| JP | 62-54960 * | 3/1987 | |
| JP | 63-178560 | 7/1988 | |
| JP | 63-318779 | 12/1988 | |
| JP | 1-114070 | 5/1989 | |
| JP | 1-160009 A | 6/1989 | |
| JP | 2-28377 * | 1/1990 | |
| JP | 2-042419 | 2/1990 | |
| JP | 2-96375 | 4/1990 | 257/384 |
| JP | 2-207537 | 8/1990 | |
| JP | 2-228041 | 9/1990 | |
| JP | 2-295111 | 12/1990 | |
| JP | 3-203322 | 9/1991 | |
| JP | 4-11722 | 1/1992 | |
| JP | 4-58564 | 2/1992 | |
| JP | 4-101453 | 4/1992 | |
| JP | 4-106982 | 4/1992 | |
| JP | 4-162679 | 6/1992 | |
| JP | 4-186775 | 7/1992 | |
| JP | 4-190329 | 7/1992 | |
| JP | 4-196171 | 7/1992 | |
| JP | 4-360580 | 12/1992 | |
| JP | 4-362616 | 12/1992 | |
| JP | 5-062928 | 3/1993 | |
| JP | 5-102410 | 4/1993 | |
| JP | 5-114724 | 5/1993 | |
| JP | 5-160153 | 6/1993 | |
| JP | 5-173179 | 7/1993 | |
| JP | 5-299655 | 11/1993 | |
| JP | 5-315355 | 11/1993 | |
| JP | 5-343426 | 12/1993 | |
| JP | 6-013615 | 1/1994 | |
| JP | 7-38115 | 2/1995 | |

OTHER PUBLICATIONS

Dvurechenskii et al., "Transport Phenomena in Amorphous Silicon Doped by Ion Implantation of 3d Metals", 1986, pp. 635–640, Phys. Stat. Sol. (a) 95.

Hemple et al., "Needle–like Crystallization of Ni Doped Amorphous Silicon Thin Films", 3/93, pp. 921–924, Solid State Communications, vol. 85, No. 11.

Kakkad et al., "Crystallized Si–Films By Low–Temperature Rapid Thermal Annealing of Amorphous Silicon", Mar. 1, 1989, pp. 2069–2072, J. Appl. Phys. 65(5).

Kakkad et al., "Low Temperature Selective Crystallization of Amorphous Silicon", 1989, pp. 66–68, Journal of Non–Crystaline Solids, 115.

Hayzelden et al., "In Situ Transmission Electron Microscopy Studies of Silicide Mediated Crystallization of Amorphous Silicon", 1992, pp. 225–227, Appl Phys. Lett., 60(2).

Liu et al., "Selective Area Crystallization of Amorphous Silicon Films by Low–Temperature Rapid Thermal Annealing", Aug. 14, 1989, pp. 660–662, Appl Phys. Lett 55(7).

J–M. Hwang et al., IEDM '92, P. 345 "Novel Polysilicon/ TiN Stacked–Gate . . . SOI/CMOS", 1992.

M. Wittmer et al., Thin Solid films, 93(1982) 397 "Applications of TiN thin films . . . ".

M. Wittmer, et al., J. Appl. Phys., 54(3) (1983) 1423, "Characteristics of TiN gate MOSFETs".

Kistler et al., *IEEE Electron Device Letters* vol. 13, No. 5, May 1992 "Sub–Quarter–Micrometer CMOS on Ultrathin (400Å) SOI".

* cited by examiner

LASER LIGHT

THIN FILM TRANSISTOR HAVING ENHANCED FIELD MOBILITY

This application is a Divisional of application Ser. No. 08/886,138 filed Jun. 30, 1997; which itself is a Continuation of Ser. No. 08/645,695 filed May 14, 1996, now abandoned; which is a Continuation of Ser. No. 08/378,316 filed Jan. 25, 1995, now abandoned; which is a Continuation of Ser. No. 08/131,958 filed Oct. 8, 1993, now abandoned.

BACKGROUND OF THE INVENTION

1. Field of the Invention

The present invention relates to a structure of a thin film transistor (TFT) and to a process for fabricating the same. The present invention also relates to a process for fabricating an insulated gate semiconductor device on an insulator substrate and to a process for fabricating an integrated circuit (IC) obtained by assembling a plurality of said insulated gate semiconductor devices on an insulator substrate. The term "insulator substrate" as referred herein means any article having an insulating surface, and, if not particularly stated, it encompasses not only those made of insulating materials such as glass, but also articles having thereon an insulator layer and made of a material such as a semiconductor and a metal. The semiconductor device according to the present invention is useful as TFTs of active matrices of liquid crystal displays, driver circuits of image sensors, or SOI (silicon on insulator) integrated circuits and conventional semiconductor integrated circuits (e.g., microprocessors and micro controllers, micro computers, and semiconductor memories).

2. Prior Art

Recently, intensive study is performed on the process for fabricating an insulated gate semiconductor device (MOSFET) on an insulator substrate. The integrated circuits (ICs) of this type being established on an insulator substrate are advantageous considering their suitability to high speed drive, because such ICs on an insulator need not suffer stray capacitance. In contrast to these ICs, the operation speed of a conventional IC is limited by a stray capacitance, i.e., a capacitance between the connection and the substrate. The MOSFETs having formed on an insulator substrate and comprising a thin film active layer is called a thin film transistor (TFT). Those TFTs are indispensable in forming multilayered integrated circuits. At present, a TFT can be found in a conventional semiconductor IC, for example, as a load transistor of an SRAM.

Some of the recent products, for example, driver circuits for optical devices such as liquid crystal displays and image sensors, require a semiconductor IC to be formed on a transparent substrate. TFTs can be found assembled therein, however, the ICs must be formed over a wide area, and a low temperature process for fabricating TFTs is thereby required. Furthermore, in devices having a plurality of terminals each connected with semiconductor ICs on an insulator substrate, for instance, it is proposed to reduce the mounting density by forming the lower layers of the semiconductor IC or the entire semiconductor IC itself monolithically on the same insulator substrate.

Conventionally, TFTs of high quality have been obtained by thermally annealing an amorphous or semi-amorphous film, or a microcrystalline film at a temperature in the range of from 450 to 1,200° C. to produce a high performance semiconductor film (i.e., a semiconductor film having sufficiently high mobility). An amorphous TFT using an amorphous material for the semiconductor film can also be fabricated; however, its application field is greatly limited because of its inferior operation speed ascribed to an extremely low mobility of 5 $cm^2$/Vs or even lower, about 1 $cm^2$/Vs in general, or because of its inability of providing a P-channel TFT (PTFT). A TFT having a mobility of 5 $cm^2$/Vs or higher is available only after annealing the semiconductor film at a temperature in the range of from 450 to 1,200° C. A PTFT can be fabricated only after subjecting the film to such annealing treatments.

However, in a thermal process involving heating at a high temperature, in particular, only strictly selected substrate material can be used. More specifically, a so-called high temperature process which involves high temperature heating in the range of from 900 to 1,200° C. is advantageous, because it allows the use of a high quality film obtainable by thermal oxidation as a gate dielectric, but substrates applicable to the high temperature process are confined to those made from expensive materials such as quartz, sapphire, and spinel, which are not suited for substrates to use in large area applications.

In contrast to the high temperature process above, a low temperature process, in which maximum temperature is in the range of from 450 to 750° C., allows the use of substrate materials selected from a wider variety. However, such a process requires long annealing, and moreover, the sheet resistance of the source/drain remains high due to insufficient activation of the impurities. There is also an attempt of crystallizing the active layer and of activating source/drain by irradiating a laser beam and the like (this process is denoted as "laser process", hereinafter), however, it has been found also difficult to lower the sheet resistance. In fabricating a TFT having a field mobility higher than 150 $cm^2$/Vs, in particular, it is essential to achieve a sheet resistance of not higher than 200 $\Omega/cm^2$.

It is also well known to use TFTs in devices such as active matrix-driven liquid crystal display devices and image sensors comprising glass substrates having integrated elements thereon. FIG. 9 schematically shows a cross sectional view of a conventional TFT. FIG. 12 shows schematically a cross sectional view of another conventional TFT and an example of the step sequential process for fabricating the same. FIG. 9(A) shows an insulated gate field effect transistor (referred to simply hereinafter as a "TFT") using a thin film silicon semiconductor provided on a glass substrate. Referring to FIG. 9(A), a silicon oxide film 62 about 2,000 Å in thickness as a base is formed on a glass substrate 61, and an active layer comprising a silicon semiconductor film having source/drain regions 63 and 65 together with a channel forming region 64 is formed on the silicon oxide film 62. An amorphous or crystalline (polycrystalline or microcrystalline) silicon semiconductor layer is provided at a thickness of about 1,000 Å.

A silicon oxide film 66 about 1,000 Å in thickness as a gate insulator film is formed on the active layer. An aluminum gate contact 67 is established thereon, and it is surrounded by an oxide layer 68 about 2,000 Å in thickness formed by anodic oxidation. An interlayer insulator 69 is formed using silicon oxide, etc., and source/drain contacts 70 and 71, as well as a contact hole 72 to the gate contact 67 are established therein. In FIG. 9(A), the contact hole 72 connected to the gate contact 67 is not in the same plane as that on which the source/drain contacts 70 and 71 are located, but is provided either beyond or at the front of the plane.

The structure shown in FIG. 9(A) is characterized in that an offset gate region can be formed in a self aligned manner by controlling the anodic oxidation of the aluminum gate contact 67. The thickness 73 of the oxide layer 68 around the gate contact 67 depends on this controlled thickness which results from anodic oxidation. More specifically, an offset region corresponding to the thickness of the oxide layer 68 can be established by implanting impurity ions for forming source/drain regions after forming the oxide layer 68.

However, because of the diffusion of the impurities, the boundary between the channel forming region 64 and the source/drain regions 63 and 65 in practice is located at a portion nearer to the channel forming portion than the portion corresponding to the edge of the oxide layer 68. Thus, the thickness of the oxide layer 68 must be determined taking the influence of diffusion into consideration. In general, the oxide layer 68 must be formed thicker than the length of the desired offset gate.

The contact holes connected to the source/drain regions 63 and 65 must be perforated with care not to be overetched. An excessive etching beyond the boundary between the silicon oxide film 66 and into the peripheral portion of the contact hole allows aluminum to diffuse into the etched peripheral portion upon forming the aluminum contacts 70 and 71, and in extreme cases, the diffusion of aluminum inside the vicinity of the channel forming region 64 impairs the characteristics and the reliability of the TFT.

On the other hand, the sheet resistance between the channel forming region 64 and the contact portions of the source/drain regions becomes a problem with increasing distance 74 therebetween. This problem may be solved by shortening the distance 74, however, this countermeasure is limited to a certain extent because too short a distance reversely impairs the precision upon matching the mask. This is a serious problem particularly when a glass substrate is used, because shrinking of the glass substrate occurs during the heating steps (various types of annealing steps are indispensable) to give unfavorable results upon matching the mask. For instance, a 10-cm square or a larger glass substrate readily shrinks for about several micrometers upon heat treatment at about 600° C. Accordingly, in a present-day process, a margin of about 20 $\mu$m is always included in the distance 74.

Considering the problem of overetching upon forming contact holes connected to the source/drain regions, on the other hand, it is not possible to excessively shorten the distance 74. As described in the foregoing, the conventional TFTs suffer the following disadvantages:

(1) Problems are associated with the formation of contact holes connected to the source/drain regions; and (2) In view of the above problem (1), sheet resistance of the source/drain regions is also a problem because the contact hole cannot be located in the vicinity of the channel forming region.

As a means of overcoming the shortcomings (1) and (2) of the conventional TFTs as mentioned hereinbefore, a TFT of a structure shown in FIG. 9(B) is proposed. This TFT comprises a gate contact 67 comprising aluminum as the principal component and is surrounded by an oxide layer 68 formed by anodic oxidation in the similar manner as in the TFT shown in FIG. 9(A). Accordingly, source/drain contacts 70 and 71 are provided in tight contact with the oxide layer 68. In this structure, however, the gate contact is located next to source/drain contacts 70 and 71 with only the oxide layer 68 incorporated therebetween. Accordingly, a parasitic capacity which forms by the incorporation of the oxide layer 68 makes the operation unstable and lowers the reliability. of the TFT. This problem can be overcome by increasing the thickness of the oxide layer 68. However, since the thickness of the oxide layer 68 corresponds to the length of the offset gate, the thickness thereof can not be simply increased as desired. In addition, pinholes in the oxide layer 68 give occasion to leakage between the gate contact and the source/drain contacts. At any rate, this type of TFT is not practically feasible.

FIG. 12 shows another insulated gate field effect transistor (referred to simply hereinafter as "TFT") comprising a thin film silicon semiconductor on a glass substrate. The process for fabricating the structure is described below. Referring to FIG. 12(A), a silicon oxide film 1302 about 2,000 Å in thickness is formed on a glass substrate 1301, and further, an island-like active layer 1303 made of a silicon semiconductor film is formed to a thickness of about 500 to 2,000 Å on the silicon oxide film 1302. The silicon semiconductor film is either amorphous or crystalline (e.g., polycrystalline and microcrystalline). A silicon oxide film 1304 about 1,000 to 1,500 Å in thickness is formed further on the active layer to give a gate insulator film.

Then, a gate contact 1305 is formed from an impurity-doped polycrystalline silicon (polysilicon), tantalum, titanium, aluminum, etc. (see FIG. 12(B)).

Source/drain regions (impurity regions) 1306 are formed in the active layer 1303 in a self aligned manner by introducing impurities such an phosphorus and boron. This is performed using processes such as ion doping, employing the gate contact as the mask. The active region under the gate contact and which remains undoped provides a channel forming region 1307 (see FIG. 12(C)).

The doped impurities are then activated by irradiating a laser beam or by using heat sources such as flash lamps (see FIG. 12(D)).

Then, a silicon oxide film is formed by a process such as plasma CVD and APCVD to give the interlayer insulator 1307. Furthermore, contact holes are perforated in the source/drain regions through the interlayer insulator to provide connection and contacts 1308 connected to the source/drain using a metallic material such as aluminum (see FIG. 12(E)).

In a conventional TFT as described in the foregoing, it is essential to lower the sheet resistance of the source/drain regions to improve the TFT properties, particularly, the field mobility and the sub-threshold characteristics (S value). The following measures were proposed to achieve the requirement:

(1) Increasing the concentration of the doped impurities;

(2) Increasing the activation energy (the intensity of a laser beam or a flash lamp) to a sufficiently high value; and (3) Decreasing the distance (indicated with "z" in FIG. 12(E)) between the channel forming region 1307 and the metal contact 1308.

With respect to the measure (1) above, an increase in the doped impurity concentration signifies an increase in the treatment duration and hence, a decrease in throughput. Moreover, the damage of the active layer and the gate insulator film 1304 increases with increasing concentration of the doped impurities. A process such as ion doping and plasma doping, which comprises producing a plasma of the impurities and accelerating it for impurity implantation, is a superior method of mass production. However, the accelerated ions contain a plurality atoms such as of hydrogen to result in a heat up of the substrate. This problem becomes particularly distinct with increasing density of the plasma. Accordingly, problems occur upon doping, including heating up of the device and thereby damaging it, and, in case a photoresist is used, carbonizing it and thereby making its removal difficult.

Concerning the measure (2) above, too intense an energy not only causes peeling off of the active layer or the gate contact and thereby lowering the yield of the TFT, but also impairs the throughput. In using a laser, for instance, it is necessary to intensely converge the beam to increase the energy density, because the energy itself cannot be greatly intensified. This inevitably decreases the beam area, and the treatment hence requires a longer duration of irradiation to cover an area of the same size.

The measure (3) depends on the precision of matching the mask, and no considerable improvement can be expected. This is a serious problem particularly when a glass substrate is used, because shrinking of the glass substrate occurs during the heating steps (various types of annealing steps are indispensable in the process) to give unfavorable results upon matching the mask. For instance, a 10 cm square or larger glass substrate readily shrinks for about several micrometers upon heat treatment at about 600° C. Accordingly, in a present-day process, a margin of about 20 $\mu$m is always included in the distance z. When z is small, moreover, a large parasitic capacity generates between the gate contact 1305 and the source/drain contacts 1308 to unfavorably affect the properties of the TFT.

On forming contact holes in the source/drain regions 1306, it is required that the etching is conducted slightly in excess to assure the formation of the contact holes. Accordingly, the distance z cannot be shortened to a large extent. As described in the foregoing, it is next to impossible to further lower the parasitic resistance of the source/drain regions so long a prior art process is employed.

SUMMARY OF THE INVENTION

The present invention has been accomplished in the light of the aforementioned problems. Accordingly, an object of the present invention is to provide a TFT which can be fabricated by a process whose maximum temperature is 750° C. or lower and whose sheet resistance is sufficiently lowered without limiting the substrate material unlike a high temperature process.

Another object of the present invention is to provide a process for fabricating the above TFT.

Still another object of the present invention is to provide a TFT having excellent characteristics, by substantially shortening the distance between the channel forming region and the source/drain contacts, and thereby lowering the resistance therebetween. Yet another object of the present invention is to accomplish the above objects by a process suited for mass production.

It is a further object of the present invention to provide a TFT having contacts connected to source/drain regions being formed accurately at positions near to the channel forming region, or to provide a TFT highly reliable upon forming contact holes in the source/drain regions.

DETAILED DESCRIPTION OF THE INVENTION

Figure 1A:
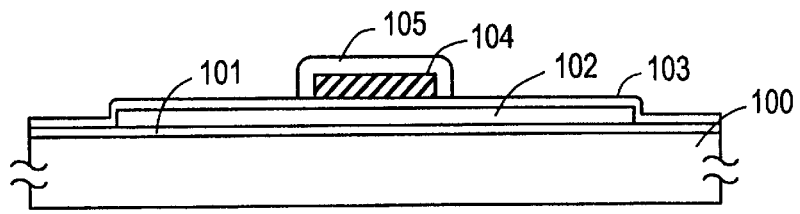
FIGS. 1(A) to 1(F) show a step sequential process for fabricating a TFT according to an embodiment of the present invention.

Conventional low temperature processes (with a maximum temperature of 750° C. or lower) or laser processes could only yield a TFT having insufficiently activated source/drain, which resulted in a device having such a high sheet resistance with a minimum in the range of from 100 to 1 k$\Omega$/cm$^2$. Accordingly, the TFT was unable to exhibit the characteristics (particularly, the mobility) inherent in the device.

More specifically, the device suffered a decrease in the ON current and the operation rate due to the presence of a large source/drain parasitic resistance between the source contact and the drain contact. However, on the other hand, it was not possible nor difficult to bring the source contact nearer to the drain contact as desired, because of the minimum limit in pattern formation (the minimum design rule) and of the necessity of lowering the parasitic. capacity between the gate contact and other connections.

In the light of the above circumstances, the present invention is characterized in that the sheet resistance of the source/drain is lowered substantially to 100 $\Omega$/cm$^2$ or lower by tightly adhering a silicide layer comprising an alloy of a metal and silicon, to the source/drain, and shaping the silicide layer to substantially the same shape as that of the source/drain. Because the silicide is layered, the parasitic capacity between it and the gate contact remains about the same as that of the conventional source/drain. The present invention is particularly characterized in that the gate contact is covered by the anodic oxide thereof, that the source/drain regions are formed in a self aligned manner with respect to the gate contact, and that a thin film silicide is formed tightly adhered to the source/drain regions.

The metal material for use in the silicide is preferably a material capable of forming an ohmic contact or a like contact of low resistance when used as a silicide and formed on a silicon semiconductor. More specifically, suited as such metal material are molybdenum (Mo), tungsten (W), platinum (Pt), chromium (Cr), titanium (Ti), and cobalt (Co). The present invention can be implemented by reacting one of the above enumerated metals with silicon to obtain a silicide.

The insulating anodic oxide plays an important role in the present invention. The anodic oxide prevents the silicide on the source/drain from forming a short circuit with the gate contact. That is, the silicide is provided over substantially the entire surface of the source/drain so that it may be brought to the vicinity of the gate contact as a result. The source/drain are separated from the gate contact by a gate insulator film. However, since the process according to the present invention requires a silicide to be formed after once removing the gate insulator film from the source/drain, it is very likely that the silicide is brought into contact with the gate contact. If an anodic oxide is present at least at the side of the gate contact, it is possible to prevent the contact between the silicide and the gate contact, and an extremely dense anodic oxide having favorable insulating property can be obtained to considerably reduce the possibility of forming short circuit.

Furthermore, considering the sequential process steps, an extremely improved process yield can be obtained by forming an anodic oxide having an etching property differing from the gate contact. If the silicide film were to be formed without covering the gate contact with an anodic oxide, and if the un-silicified metal film should have approximately the same etching rate as that of the gate contact, a part or the entire gate contact would be etched upon removing the un-silicified metal film. From the view point of etching, accordingly, an anodic oxide is preferably formed on the upper surface of the gate contact.

The process for fabricating the TFT according to the present invention comprises the following four basic steps:

(1) anodically oxidizing the gate contact;
(2) forming a metal coating for forming a silicide on the exposed surface (inclusive of the silicon semiconductor region) of the element;
(3) forming a silicide at the boundary between silicon and said metal coating, by irradiating an intense light such as a laser beam to allow silicon to react with said metal coating; and
(4) removing the metal coating remained unreacted.

In the present invention, either a monolayer gate contact using the above material singly or a multilayered gate contact comprising two or more laminated layers may be used. For instance, a bilayer structure comprising a tungsten silicide layer on an aluminum layer, or such comprising an aluminum layer on a titanium nitride layer. The thickness of each of the layers is determined according to the desired element characteristics.

The silicide in the present invention is formed by irradiating an intense light such as a laser beam to the metal film, thereby allowing the metal film to react with the underlying silicon semiconductor film. If a laser were to be used as the intense light, a pulsed laser is preferably used. A laser operating in a continuous wave mode is not preferred because the irradiation time of the laser is too long. Not only peeling off of the irradiated film due to thermal expansion is feared to occur, but also thermal damage of the substrate is suspected on the structure.

Concerning the lasers operating in a pulsed mode for use in the present invention, mentioned are an infrared emitting laser such as an Nd:YAG laser (a Q switch pulsed laser is preferred) or a visible light emitting laser such as a second harmonic thereof, or various types of ultraviolet emitting excimer lasers of KrF, XeCl, ArF, etc. When irradiating laser from the upper side of the metal film, however, a laser operating in such a wavelength range that the beam should not be reflected by the metal film should be selected. As a matter of course, this selection is unnecessary if a very thin metal film is used. Furthermore, the laser beam may be irradiated from the substrate side. If the laser were to be irradiated from the substrate side, however, a laser beam capable of penetrating the silicon semiconductor film under the metal film must be selected.

The thickness of the silicide layer depends on the sheet resistance required to the source/drain region. Considering that the resistivity of the silicide is in the range of from 0.1 to 1 mΩ·cm, the silicide layer is favorably provided at a thickness in the range of from 10 nm to 1 $\mu$m to achieve a sheet resistance in the range of from 10 to 100 $\Omega/cm^2$.

Referring to FIG. 5, another embodiment according to the present invention is described below. A gate contact 15 based on aluminum is surrounded by an aluminum oxide layer 16, and the aluminum oxide layer is further surrounded by an insulator (silicon oxide) 22 shaped approximately in a triangle. This insulator 22 fixes the contact position between source/drain regions 17 and 19 and the contacts 29 and 30. This insulator shaped approximately in a triangle can be formed on the portion indicated with numeral 21 by etching a silicon oxide film 20 anisotropically along the vertical direction (etching selectively along the vertical direction).

The dimension, particularly the width, of this insulator 22 shaped into approximately a triangle depends on the thickness of a previously deposited insulator 20, the etching conditions, and the height of the gate contact 15 (inclusive of the thickness of the insulator layer 16). The width 22 is generally in the range of from 2,000 to 20,000 Å, but it can be determined according to the respective embodiments irrespective of the above specified range. Furthermore, the shape of the insulator 22 is not only limited to a triangle, and is varied according to the step coverage of the oxide 20 and to the film thickness. For example, if the dimension indicated by 25 is shortened, the resulting shape is a rectangle. In the present specification, however, the insulator 22 referred to herein is exemplified by "an insulator shaped approximately into a triangle", or more briefly as "a triangular insulator", as shown in the drawing for the sake of simplicity.

A compound of silicon with a metal (referred to hereinafter as "a silicide") 28 is formed at the contact portion between the source/drain contacts 29 and 30 with the source/drain regions 17 and 19. The contact resistance and the sheet resistance of the source/drain regions 17 and 19 are lowered by the presence of this silicide. The silicide 28 can be established by depositing a film 27 of a constituent metal of the silicide on a silicon film, and applying heat treatment thereto depending to the requirements. Silicides more specifically include those using, as the constituent metal, Ti (TiSi and $TiSi_2$), Mo ($MoSiO_2$), W ($WSi_2$, $W(SiAl)_2$), $TiSi_2$ ($Ti_7Si_{12}Al_5$), and $Pd_2Si$ ($Pd_4SiAl_3$). However, the use of Ti as TiSi and $TiSi_2$ is preferred from the viewpoint of the problems concerning the treatment temperature, contact resistance, and sheet resistance.

The TFT shown in FIG. 5 comprises a gate contact surrounded by an insulator layer 16. However, the insulator layer may be omitted and an insulator 22 may be brought into intimate contact with the gate contact.

Referring to FIG. 7, a further preferred embodiment according to the present invention is described below. The structure shown in FIG. 7 comprises a silicide layer 90 to lower the sheet resistance of the source/drain regions. The source/drain contacts are located at a position (indicated by 94) distant from the channel forming region 87, in a way similar to the structure of an ordinary TFT. The sheet resistance of the source/drain regions can be lowered by employing a structure of this type. Accordingly, a TFT having improved characteristics can be obtained even if the source/drain contacts are located at an ordinary position shown in FIG. 7(D).

The formation of a triangular insulator on the sides of the gate contact in a self aligned manner dispenses with the contact holes in the source/drain regions. Furthermore, the presence of this triangular insulator allows formation of the contacts in the source/drain regions at positions nearer to the channel forming regions. Furthermore, the formation of silicide on the surface of the source/drain regions lowers not only the contact resistance between them with the source/drain contacts, but also the sheet resistance in the source/drain regions.

Moreover, even when a TFT of a conventional structure were to be used,.the sheet resistance of the source/drain regions can be lowered by forming a silicide layer of a metal on the surface of the source/drain regions. Accordingly, a TFT having improved characteristics can be obtained.

Furthermore, an interlayer insulator having contact holes may be provided on the silicide layer, and source/drain contacts may be connected to the source/drain regions through the contact holes in direct contact with the silicide layer.

The process according to the present invention comprises forming an oxide coating by oxidizing at least the sides, preferably the upper surface and the sides, of the gate contact. Preferably, the oxide coating is an excellent insulator. A triangular insulator is further formed on the outer side of the oxide on the gate contact. The width of the triangular insulator is preferably less than 1 $\mu$m. The silicide is formed tightly adhered to the source/drain regions in a self aligned manner to the triangular insulator. Because the silicide has a resistivity far lower than a polycrystalline silicon, a sufficiently low resistance can be obtained by providing it extremely thinly.

FIG. 10 refers to a concrete example of the technological idea above, and it shows sequential steps for fabricating the TFT of the above constitution. Referring to FIG. 10, a base oxide film 1102, source/drain regions 1103, a channel forming region 1104, a gate insulator film 1105, and a gate contact 1106 comprising metals such as aluminum, titanium, and tantalum, or an alloy thereof as the principal component, were formed sequentially in this order on a substrate 1101 using a known means. An oxide layer 1107 for the gate contact is then formed around the gate contact. A thermal oxidation process or an anodic oxidation process Is suited for the formation of the oxide layer. When a metal based on aluminum, titanium, or tantalum, or an alloy comprising them as the principal component is used as the gate contact, the oxide layer is preferably formed by anodic oxidation. Since the impurities are doped in a self aligned manner with respect to the oxide layer 1107, the source/drain regions and the gate contact are offset (FIG. 10(A)).

The selection of the gate contact material is the key when using anodic oxidation, because the type of the anodic oxide depends on the gate contact material. Gate contact materials useful in the present invention include pure metals (e.g., aluminum, titanium, tantalum, and silicon), alloys thereof added therein a small amount of other additives (e.g., an aluminum based alloy containing from 1 to 3% silicon as an additive, and a silicon based alloy containing from 1,000 ppm to 5% phosphorus), electrically conductive silicides such as tungsten silicide ($WSi_2$) and molybdenum silicide ($MoSi_2$), and electrically conductive nitrides represented by titanium nitride. "Aluminum" as referred herein not only signifies pure aluminum, but includes also aluminum alloys containing 10% or less of an additive. The same applies to silicon and other materials. An insulating coating 1108 is formed thereafter. This insulating coating must exhibit excellent coverage on the sides of the gate contact (FIG. 10(B)).

The insulating coating is then subjected to anisotropic etching using a process such as dry etching. That is, etching is performed selectively only along the vertical direction. As a result, the surface of the source/drain regions are exposed, while a triangular insulator 1109 is left on the sides of the gate contact inclusive of the surrounding oxide coating 1107.

The dimension, particularly the width, of this triangular insulator 1109 depends on the thickness of a previously deposited insulator coating 1108, the etching conditions, and the height of the gate contact (inclusive of the surrounding oxide layer 1107). In this case, the height includes the thickness of the insulator layer 1107. The thickness of the insulating coating 1108 is generally in the range of from 2,000 to 20,000 Å, but it can be determined according to the respective embodiments irrespective of the above specified range. Furthermore, the shape of the insulator 1109 is not only limited to a triangle, and is varied according to the step coverage of the insulating coating 1108 and to the film thickness. For example, if a thin coating is provided, the resulting shape is a rectangle. However, the insulator 1109 as referred to hereinafter is collectively exemplified by an insulator shaped approximately into a triangle as shown in the drawing for the sake of simplicity.

Figure 10A:
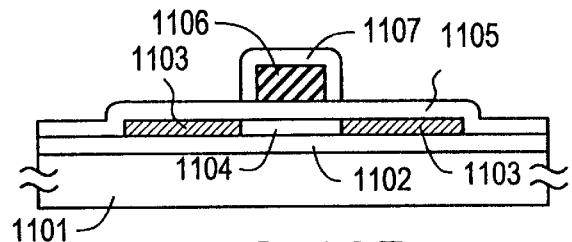
FIGS. 10(A) to 10(F) show a step sequential process for fabricating another TFT according to another embodiment of the present invention.
Figure 10B:
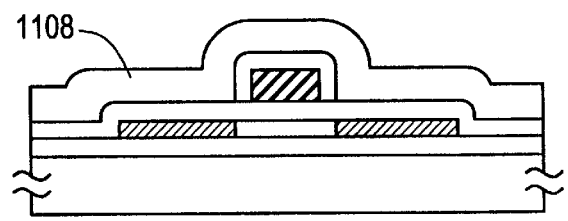
Figure 10C:
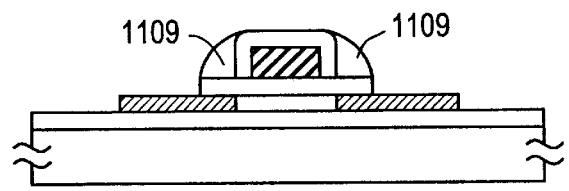
Figure 10D:
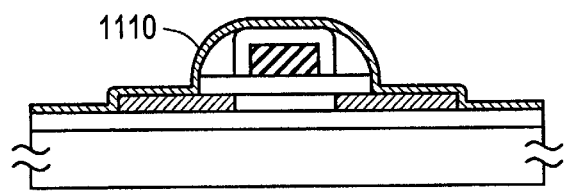

A coating 1110 of a suitable metal, such as titanium, molybdenum, tungsten, platinum, and palladium is formed on the front surface of the substrate (FIG. 10(D)).

Then, a silicide layer is formed by reacting the thus formed metal film with silicon of the source/drain region. This process can be performed by annealing at an appropriate temperature or by an annealing process and the like using a laser, a flash lamp, etc. The metal film remains as it is without reacting with other materials such as silicon oxide and silicon nitride, or with a material constituting the oxide layer 1107 of the gate contact, e.g., aluminum oxide, titanium oxide, and tantalum oxide. Accordingly, a silicide and a metal film remains on the substrate at the same time, but the metal film alone can be selectively etched by using a proper etchant. In this case, the important point is that an oxide layer 1107 is provided on the upper surface of the gate contact. The oxide layer 1107 prevents direct reaction from occurring between the metal film 1110 and the gate contact 1106. In this manner, the silicide layer 1111 alone is left in contact with the source/drain region (FIG. 10(E)).

A laser operating in a pulsed mode is preferred when the silicide is formed by irradiating an intense light such as a laser to the metal film to allow it to react with the underlying silicon semiconductor film. A laser operating in a continuous wave mode is not preferred because the irradiation time of the laser is too long. A peeling off of the laser irradiated film may occur due to thermal expansion.

As a matter of course, the silicide layer may be provided at the same thickness as that of the active layer, though the silicide layer in the figure is illustrated thinner than the active layer. The point is that the active layer region under the insulator 1109 is an impurity semiconductor which provides the source/drain region. The silicides for use in the silicide layer 1110 include those using, as the constituent metal, Ti (TiSi and $TiSi_2$), Mo ($MoSiO_2$), W ($WSi_2$, W(SiAl)$_2$), TiSi$_2$ (Ti$_7$Si$_{12}$Al$_5$), and Pd$_2$Si (Pd$_4$SiAl$_3$). However, the use of Ti as TiSi and TiSi$_2$ is preferred from the viewpoint of the problems concerning the treatment temperature, contact resistance, and sheet resistance.

Subsequently, an interlayer insulator 1112 is deposited, a contact hole is perforated in the silicide layer 1111, and a metal contact with connection 1113 is formed to obtain a complete TFT. The resulting structure is shown in FIG. 10(F).

As described in the foregoing, the TFT according to the present invention comprises a silicide layer 1111 having an extremely low resistance. Accordingly, the resistance between the channel forming region and the metal contact is determined substantially by the distance indicated with x in FIG. 10(F). Because the distance x is preferably 10 μm or less, the resistance can be considerably lowered. As a matter of course, the distance between the contact hole and the gate contact can be set the same as in prior art TFTs.

Figure 10E:
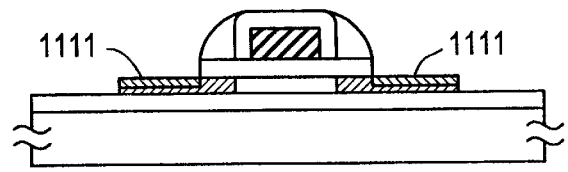
Figure 10F:
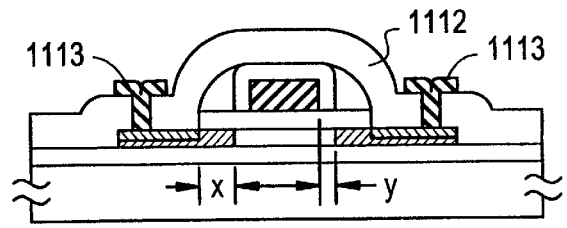

The offset (marked with y in FIG. 10(F)) as referred hereinbefore is effective for reducing the leak current of the TFT.

Referring to FIG. 11, another preferred embodiment according to the present invention is described below. In the present embodiment again, a base oxide film 1202, an active layer comprising source/drain regions 1203 and a channel forming region 1204, a gate insulator film 1205, and a gate contact 1206 surrounded by an oxide layer are formed on a substrate 1201 (see FIG. 11(A)) in the same manner as in the embodiment illustrated in FIG. 10.

The gate insulator film 1205 is etched in a self aligned manner using the gate contact and its surrounding oxide layer 1207 as the mask. If an oxide layer 1207 comprising aluminum oxide as the principal component and a gate insulator film based on silicon oxide are formed, for instance, dry etching using a fluorine based etching gas (e.g., gases of NF$_3$ and SF$_6$) can be performed. Under those etching gases, the gate insulator film based on silicon oxide is etched swiftly, but the aluminum oxide based layer is etched at a sufficiently low rate to effect selective etching.

Figure 11A:
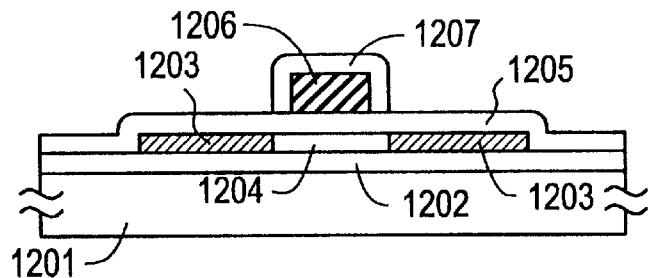
FIGS. 11(A) to 11(E) show a step sequential process for fabricating another TFT according to still another embodiment of the present invention.
Figure 11B:
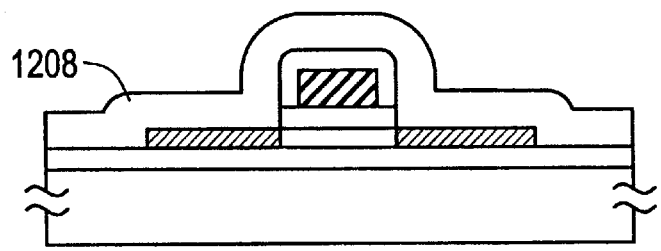

An insulating coating 1208 is deposited on the front surface subsequently thereafter to provide a structure shown in FIG. 11(B).

The resulting structure is then subjected to anisotropic etching in the same manner as in the case illustrated in FIG. 10 to leave over triangular insulator 1209 on the sides of the gate contact. This step is followed by the deposition of a coating 1210 of an appropriate metal (see FIG. 11 (C)).

Figure 11C:
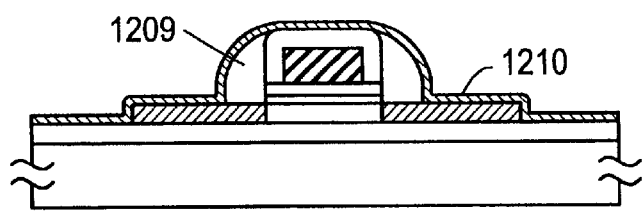
Figure 11D:
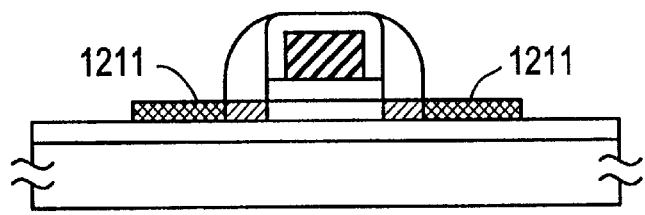

The metal coating is reacted with silicon thereafter by using a suitable heat treatment, laser irradiation, etc., to obtain a silicide layer 1211 (FIG. 11(D)).

Figure 11E:
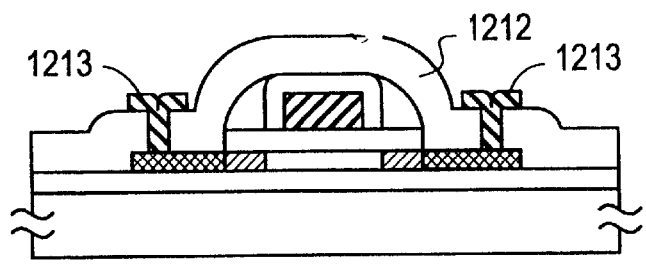
Figure 12A:
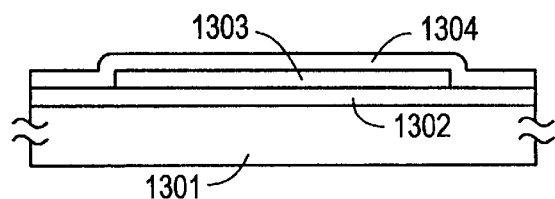
FIGS. 12(A) to 12(E) show a step sequential process for fabricating a prior art TFT.
Figure 12B:
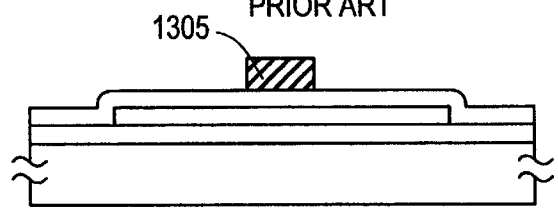
Figure 12C:
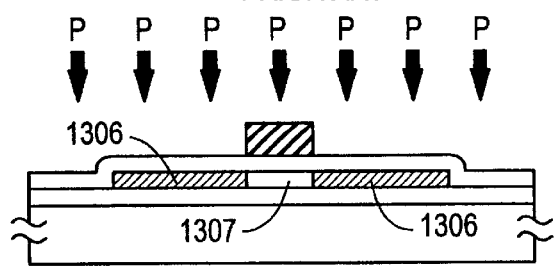
Figure 12D:
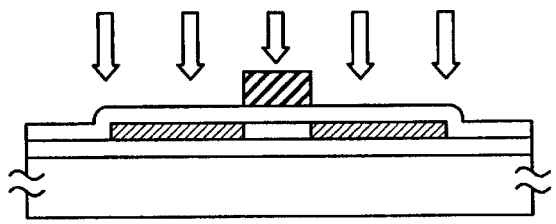
Figure 12E:
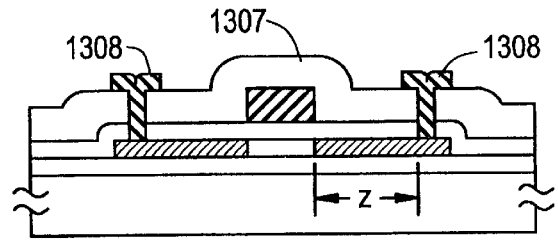

An interlayer insulator 1212 and a metal contact with connection 1213 are formed thereafter to obtain a structure shown in FIG. 11(E).

Similarly to the case shown in FIG. 10, the resistance between the channel forming region and the source/drain contacts can be provided sufficiently low in this embodiment.

As described in the foregoing, the present invention provides a high performance TFT whose resistance between the channel forming region and the source/drain contacts is advantageously reduced by substantially shortening the distance therebetween. However, the advantage of the present invention is not only limited thereto. The sufficiently low resistance offers a reduced amount of impurities doped in the source/drain regions. More specifically, for example, a dose of 1×10$^{15}$ to 8×10$^{15}$ cm$^{-2}$ generally required for impurity doping can be reduced by one digit or more, i.e., to a dose of 5×10$^{13}$ to 1×10$^{15}$ cm$^{-2}$. Even with a lower dose of doped impurities, improved characteristics can be assured to the TFT obtained by the present invention. It can be seen by simple calculation that the doping step can be shortened to one tenth by employing the present invention.

Still advantageously, the damage done to the boundary between the channel forming region and the source/drain regions can be reduced by conducting impurity doping of low concentration. In a case the impurities are activated by laser annealing and the like, in particular, the degradation due to the impurities doped in a large concentration has been recognized as a serious problem because the gate contact and the like functioned as a shade to cause insufficient activation at the boundary between the channel forming region and the source/drain regions. An impurity doping of low concentration as in the present invention can effectively circumvent such a problem.

Furthermore, the active layer can be provided thinner. In a prior art process, it was difficult to reduce the thickness of the active layer to 1,000 Å or less, and more particularly, to 500 Å or less, because the sheet resistance of the source/drain was high. However, the TFT according to the present invention is free of such limitations. More specifically, a sheet resistance in the range of from 10 Ω to 1 kΩ can be realized for, e.g., a silicide layer 100 Å, because the resistivity thereof is as small as to fall within a range of from 10$^{-3}$ to 10$^{-5}$ Ω·cm.

A thinner active layer is advantageous not only in that it can be deposited within a shorter duration of film deposition, but also in that leak current and connection failure (step breakage) ascribed to insufficient step coverage of the gate insulator film and gate contact can be prevented from occurring. Conclusively, the product yield can be improved.

The present invention is illustrated in greater detail referring to non-limiting examples below and to the drawings. It should be understood, however, that the present invention is not to be construed as being limited thereto.

EXAMPLE 1

Referring to FIG. 1, a process for fabricating a TFT according to an embodiment of the present invention is described below. A 100 to 300 nm thick silicon oxide film 101 was deposited by sputtering in oxygen atmosphere as a base oxide film on a Corning 7059 substrate 100 (300 mm×400 mm in size or 100 mm×100 mm in size). As a process more suited for mass production, however, the base oxide film may be formed by decomposing and depositing TEOS (tetraethoxysilane) using plasma CVD, and annealing the resulting film at a temperature in the range of from 450 to 650° C.

Then, an amorphous silicon film was deposited by plasma CVD or LPCVD to a thickness of from 30 to 500 nm, preferably from 100 to 300 nm, and was allowed to stand in a reducing atmosphere for 24 hours at a temperature of from 550 to 600° C. to effect crystallization. This step may be performed by laser irradiation. The resulting crystallized silicon film was patterned to give island-like portion 102. A silicon oxide film 103 was further deposited thereon at a thickness of from 70 to 150 nm as a gate insulating film by sputtering.

An aluminum film containing 99% Al and 1% Si was formed thereafter at a thickness of from 200 nm to 5 μm by electron beam deposition, and was patterned to obtain a gate electrode 104 provided in contact with the gate insulating film. The resulting gate electrode was anodically oxidized in an electrolytic solution by applying current thereto. Thus was obtained a 50 to 250 nm thick anodic oxide 105 provided at least on a side of the gate electrode and comprising a material of the gate electrode as shown in FIG. 1(A). The anodic oxidation was performed under the conditions disclosed in Japanese patent application Hei-4-30220 (filed on Jan. 21, 1992).

The gate electrode may comprise an alloy of at least two materials, and the anodic oxide may comprise at least one of the at least two materials.

The surface of the silicon semiconductor 102 was exposed by removing the silicon oxide film 103 except for the portion under the gate contact and the anodic oxide. The silicon oxide film 103 can be removed by wet etching using an etching solution based on hydrofluoric acid or by dry etching.

Figure 1B:
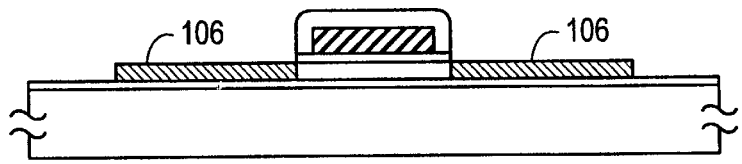

Impurities were introduced into the island-like silicon film on each of the TFTs in a self-aligned manner by ion doping process using the gate contact portion (i.e., the gate contact and the surrounding anodic oxide film) as the mask to obtain impurity region 106 as shown in FIG. 1(B). The impurity region can be formed by implanting phosphorus using phosphine ($PH_3$) as the doping gas in the case of forming an NMOS TFT, and by implanting boron using diborane ($B_2H_6$) as the doping gas to obtain a PMOS TFT. The ion doping was performed at an accelerating energy of from 10 to 60 keV.

Figure 1C:
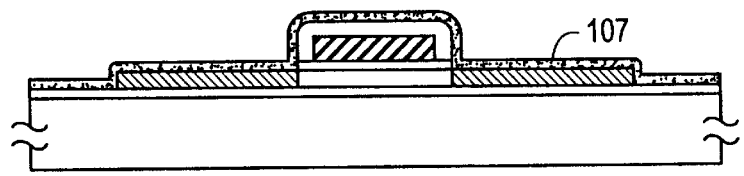
Figure 1D:
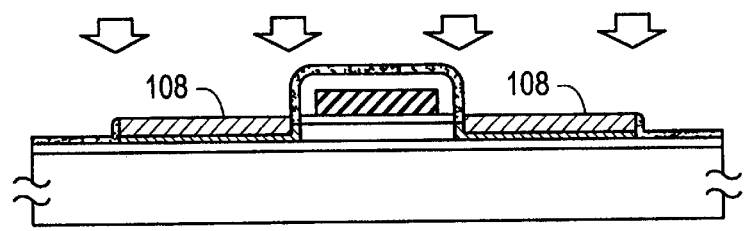

A 5 to 50 nm thick tungsten film 107 was deposited by sputtering to obtain a structure shown in FIG. 1(C). Subsequently thereafter, the deposited tungsten film was allowed to react with silicon by irradiating thereto a KrF excimer laser operating at a wavelength of 248 nm and at a pulse width of 20 nsec. Thus was obtained two tungsten silicide regions 108 provided on and in contact with the two silicon semiconductor impurity regions (source and drain) having P-type or N-type conductivity provided on the substrate. An active region which comprise a silicon semiconductor having a substantially intrinsic conductivity or an opposite conductivity type to the two silicon semiconductor regions is provided between the two silicon semiconductor regions. An appropriate laser treatment could be performed by operating the laser at an energy density of from 200 to 400 mJ/cm$^2$, preferably at an energy density of from 250 to 300 mJ/cm$^2$. The thus irradiated laser beam was mostly absorbed by the tungsten film and was therefore hardly used for the recovery of crystallinity of the silicon impurity region which had been seriously damaged in the precedent ion doping step. However, since tungsten silicide has such a low resistivity in the range of from 30 to 100 $\mu\Omega\cdot$cm, the sheet resistance of the source and drain regions (the region 108 and the impurity region under the region 108) was found to be 10 $\Omega$/cm$^2$ or lower. As a matter of course, the impurity region can be relieved of degradation by subjecting it to laser irradiation or thermal annealing, etc., immediately after the ion implantation.

Figure 1E:
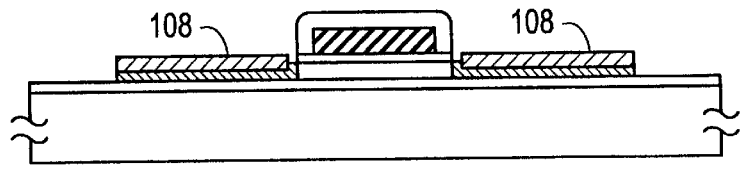
Figure 1F:
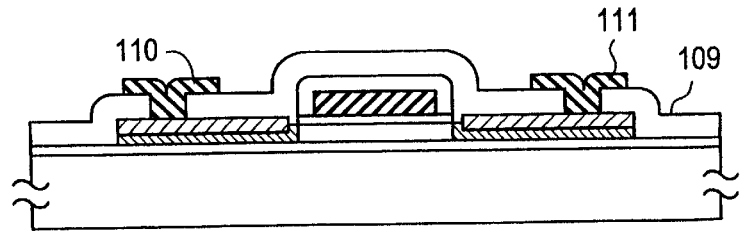

The tungsten film which remained unreacted through the irradiation of laser was removed by etching as shown in FIG. 1(E). Tungsten can be removed as tungsten hexafluoride gas by subjecting it to reactive etching in a carbon fluoride atmosphere.

Finally, a silicon oxide film was deposited to a thickness of 300 nm by CVD to provide an interlayer insulator 109 on the entire surface of the resulting structure. After perforating contact holes for the source/drain of the TFT, aluminum connections with contacts 110 and 111 were formed. In this manner, the structure was completed into a TFT. Furthermore, hydrogen annealing in the temperature range of from 200 to 400° C. can be performed to activate the impurity region.

EXAMPLE 2

Referring to FIG. 2, a process for fabricating a TFT according to an embodiment of the present invention is described below. Thus, a base oxide film 202, an island like semiconductor region, and a silicon oxide film which functions as a gate oxide film 204 were formed on a Corning 7059 substrate 100 sequentially in the same manner as in Example 1. Then, a gate contact 205 was formed from an aluminum film from 200 nm to 5 $\mu$m in thickness. As shown in FIG. 2(A), an impurity region 203 was formed by implanting impurities using the gate contact as the mask.

Figure 2A:
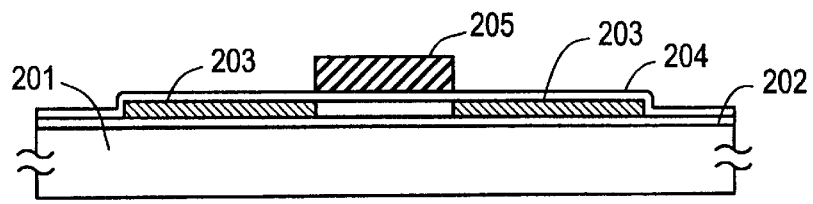
FIGS. 2(A) to 2(F) show a step sequential process for fabricating another TFT according to another embodiment of the present invention.
Figure 2B:
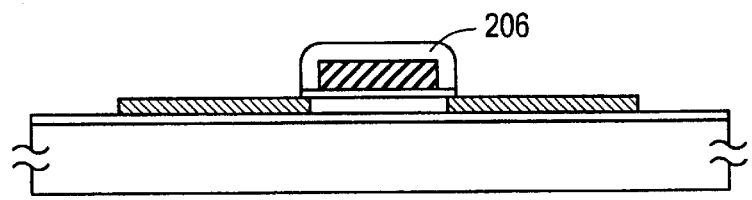

An anodic oxide 206 was then formed around the gate contact (i.e., on the sides and the upper surface of the gate contact) by anodic oxidation in the same manner as that used in Example 1. It should be noted, however, that the impurity region far intrudes into the inner of the anodic oxide as compared to the case of Example 1. Subsequently, the surface of the impurity region was exposed by removing the silicon oxide film except for the portion under the gate contact. The resulting structure is shown in FIG. 2(B). Before proceeding to the next step, laser irradiation or thermal annealing may be performed to remove damage the impurity region had received by the previous ion doping to retrieve crystallinity.

Figure 2C:
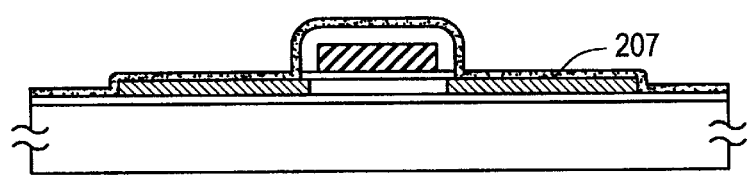
Figure 2D:
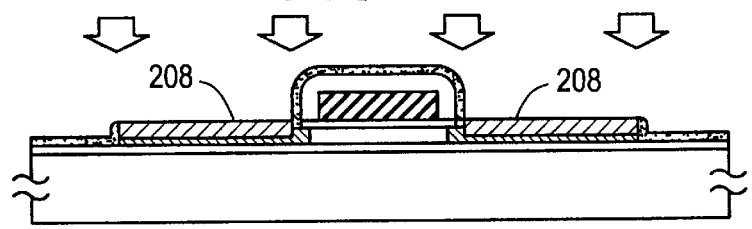

A 5 to 50 nm thick molybdenum film 207 was deposited by sputtering to obtain a structure shown in FIG. 2(C). Subsequently thereafter, the deposited molybdenum film was allowed to react with silicon by irradiating thereto a KrF excimer laser operating at a wavelength of 248 nm and at a pulse width of 20 nsec. Thus was obtained a molybdenum silicide region 208 on the impurity region (source/drain).

Figure 2E:
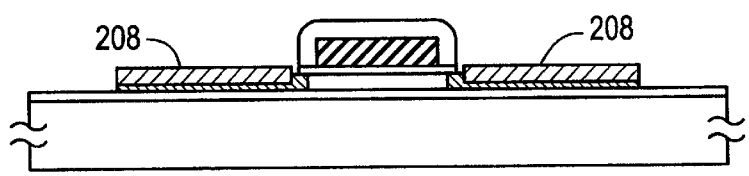
Figure 2F:
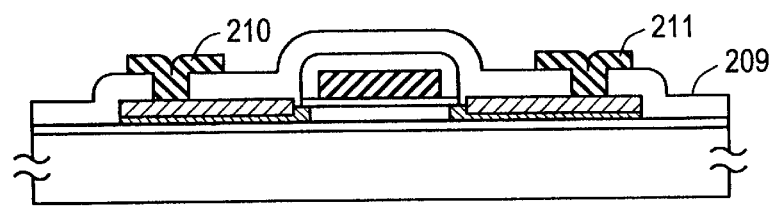

The molybdenum film which remained unreacted through the irradiation of laser was removed by etching as shown in FIG. 2(E). Finally, a silicon oxide film was deposited to a thickness of 300 nm by CVD to provide an interlayer insulator 209 on the entire surface of the resulting structure. After perforating contact holes for the source/drain of the TFT, aluminum connections with contacts 210 and 211 were formed. In this manner, a complete TFT was obtained.

EXAMPLE 3

Referring to FIG. 3, a process for fabricating a TFT according to an embodiment of the present invention is described below. Referring to FIG. 3(A), a base oxide film 301, an island like semiconductor region 302, a silicon oxide film which functions as a gate oxide film 303, and an aluminum film from 200 nm to 5 $\mu$m in thickness as a gate contact 304 were formed on a Corning 7059 substrate 300 sequentially in the same manner as in Example 1 above. Then, an anodic oxide 305 was formed on the periphery (the sides and the upper surface) of the gate contact by anodic oxidation following the same procedure as in Example 1.

Figure 3A:
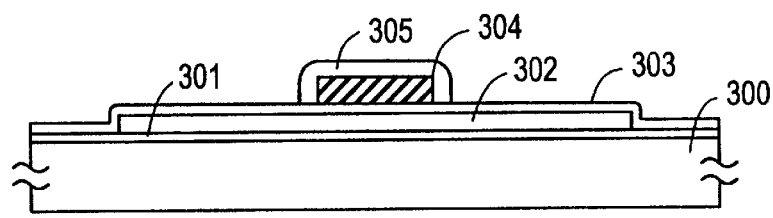
FIGS. 3(A) to 3(F) shows a step sequential process for fabricating another TFT according to still another embodiment of the present invention.
Figure 3B:
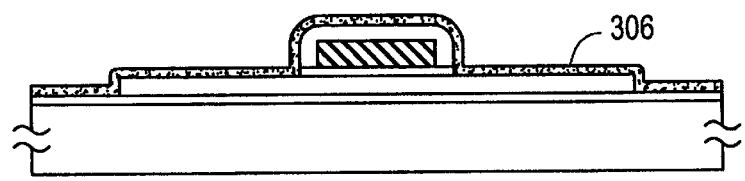
Figure 3C:
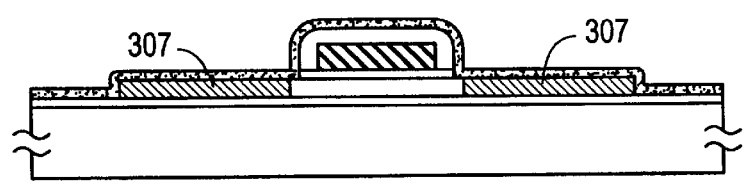
Figure 3D:
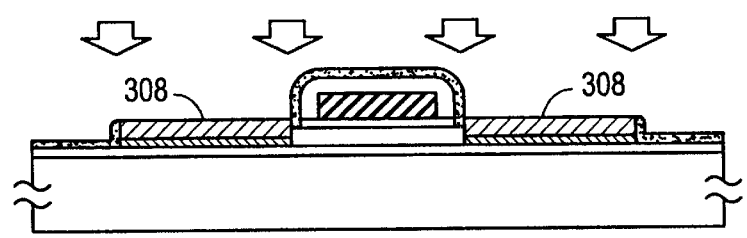
Figure 3E:
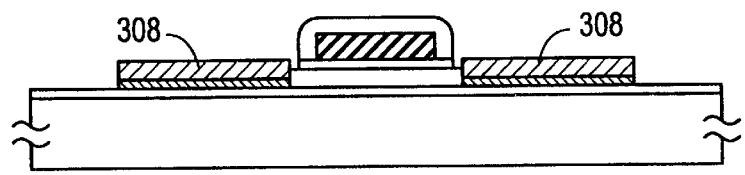
Figure 3F:
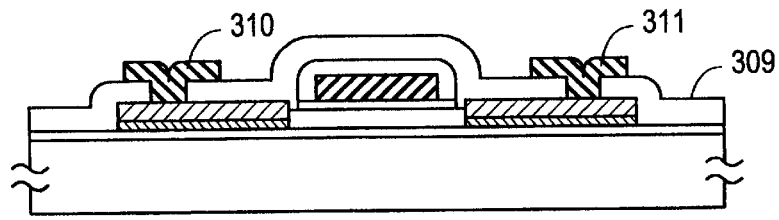

Then, the silicon oxide film 303 was removed except for the portion under the contact portion, and a 5 to 50 nm thick platinum (Pt) film 306 was deposited by sputtering to obtain a structure shown in FIG. 3(B). Impurities were introduced through the platinum film by ion doping to obtain an impurity region 307 as shown in FIG. 3(C). Subsequently thereafter, the deposited platinum film was allowed to react with silicon by irradiating thereto a KrF excimer laser operating at a wavelength of 248 nm and at a pulse width of 20 nsec. Thus was obtained a platinum silicide region 308 on the impurity region (source/drain).

The platinum film which remained unreacted through the irradiation of laser was removed by etching as shown in FIG.

3(E). Finally, a silicon oxide film was deposited to a thickness of 300 nm by CVD to provide an interlayer insulator 309 on the entire surface of the resulting structure. After perforating contact holes for the source/drain of the TFT, aluminum connections with contacts 310 and 311 were formed. In this manner, a complete TFT was obtained.

EXAMPLE 4

Referring to FIG. 4, a process for fabricating a TFT according to an embodiment of the present invention is described below. Referring to FIG. 4(A), a base oxide film 401, an island like semiconductor region 402, a silicon oxide film which functions as a gate oxide film 403, and an aluminum film from 200 nm to 5 μm in thickness as a gate contact 404 were formed on a Corning 7059 substrate 400 sequentially in the same manner as in Example 1 above. Then, an anodic oxide 405 was formed on the periphery (the sides and the upper surface) of the gate contact by anodic oxidation following the same procedure as in Example 1.

Figure 4A:
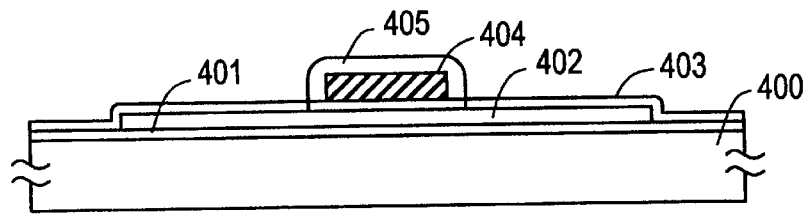
FIGS. 4(A) to 4(E) show a step sequential process for fabricating another TFT according to yet another embodiment of the present invention.
Figure 4B:
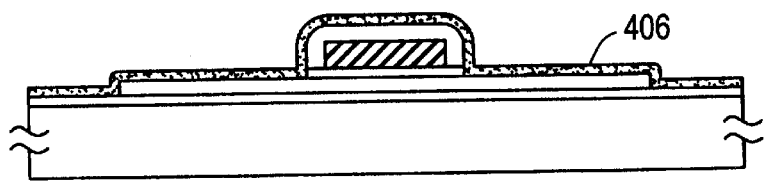
Figure 4C:
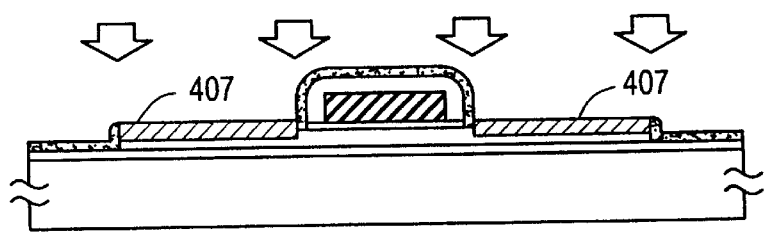

Then, the silicon oxide film 403 was removed except for the portion under the contact portion, and a 5 to 50 nm thick titanium film 406 was deposited by sputtering to obtain a structure shown in FIG. 4(B). Subsequently thereafter, the deposited titanium film was allowed to react with silicon by irradiating thereto a KrF excimer laser operating at a wavelength of 248 nm and at a pulse width of 20 nsec. Thus was obtained a titanium silicide region 407.

Figure 4D:
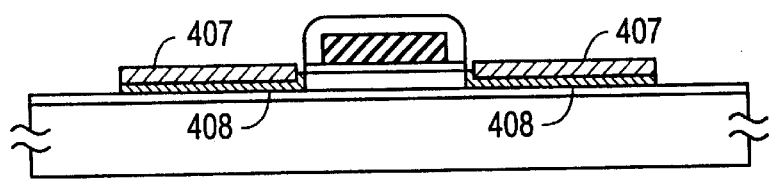
Figure 4E:
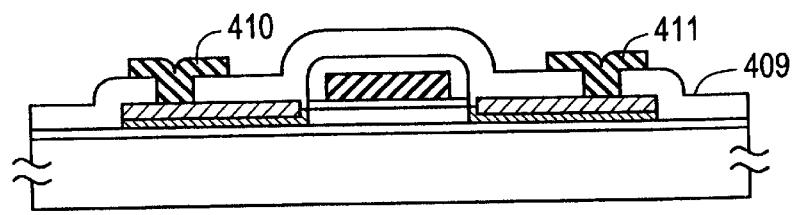

The titanium film which remained unreacted through the irradiation of laser was removed by etching as shown in FIG. 4(D). This step was followed by introducing impurities employing an ion doping process in a self aligned manner using the gate contact portion as the mask to form impurity region 408 under the titanium silicide region 407. Finally, as shown in FIG. 4(E), a silicon oxide film was deposited to a thickness of 300 nm by CVD to provide an interlayer insulator 409 on the entire surface of the resulting structure. After perforating contact holes for the source/drain of the TFT, aluminum connections with contacts 410 and 411 were formed. In this manner, a complete TFT was obtained.

EXAMPLE 5

Referring to the schematically drawn sequential steps of fabrication in FIG. 5, the process for fabricating an N-channel TFT (NTFT) according to an embodiment of the present invention is described below. As a matter of course, a P-channel TFT (PTFT) can be readily obtained by simply modifying the TFT of the present example by using a P-type semiconductor for the source/drain regions. Though the present example refers specifically to a case using silicon semiconductor, other semiconductors may be used as well. The TFT according to the present embodiment can be used as the TFT provided to the pixels of liquid crystal display devices or to the peripheral circuits, or to image sensors and other integrated circuits.

In the present example, a glass substrate 11 was used. A 2,000 Å thick silicon oxide film was deposited as a base film 12 on the surface of the glass substrate 11 by sputtering. An amorphous silicon film 13 was deposited to a thickness of 1,000 Å by plasma CVD thereafter. The film deposition method and the film thickness are not particularly limited but depend on the individual embodiment. Furthermore, a crystalline silicon film (such as a microcrystalline silicon film and polycrystalline silicon film) may be used as an alternative to the amorphous silicon film.

The amorphous silicon film 13 was crystallized thereafter to obtain a crystalline silicon film. The crystallization treatment can be easily performed by heating at 600° C. for 24 hours, however, other methods such as irradiating a laser light or an intense light can be employed as an alternative. Then, the film was patterned to isolate the elements and to thereby establish the active layer region. The active layer region as referred herein corresponds to the island-like semiconductor region in which source/drain regions and channel forming regions are formed.

A 1,000 Å thick silicon oxide film 14 was deposited by sputtering thereafter as a gate insulator film. The silicon oxide film 14 may be otherwise deposited by plasma CVD using an organic silane (such as TEOS) and oxygen. An aluminum film for a gate contact was deposited thereafter to a thickness of from 6,000 to 8,000 Å, more specifically, to a thickness of 6,000 Å in the present example. The aluminum film thus deposited contained about 0.1 to 2% silicon. The gate contact may be based on silicon, a silicide of a metal, or a laminate of silicon and a metal.

Figure 5A:
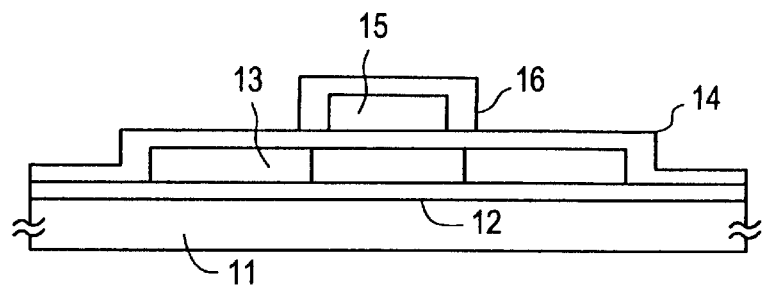
FIGS. 5(A) to 5(D) show a step sequential process for fabricating another TFT of an Example according to the present invention.

The aluminum film thus obtained was patterned to obtain a gate contact 15. The surface of the aluminum gate contact 15 was anodically oxidized thereafter to form an oxide layer 16. The anodic oxidation was effected in an ethylene glycol solution containing from 1 to 5% of tartaric acid. Thus was obtained in the present example, an oxide film 16 having a thickness of 2,000 Å on the sides, so that an offset gate region can be formed in the subsequent step of implanting impurity ions using the thickness of the film. The resulting structure is shown in FIG. 5(A).

The crystalline silicon film 13 deposited as an active layer was doped with phosphorus ions thereafter to impart N-type conductivity to the crystalline silicon film 13. In this manner, source/drain regions 17 and 19, and a channel forming region 18 were formed in a self-aligned manner by using the gate contact 15 and the surrounding oxide layer 16 as the mask. Laser annealing was performed thereafter to activate the doped phosphorus impurity and to anneal the silicon film whose crystallinity was impaired through the doping process. The annealing may be performed by irradiating infrared light using a lamp. Alternatively, a known annealing process by heating may be employed. Best preferred and most useful as the annealing process is, however, using an infrared light (e.g., a light 1.2 μm in wavelength), because infrared light can be selectively absorbed by the silicon semiconductor without considerably heating the glass substrate. Moreover, heating up of the glass substrate can be prevented by shortening the duration of irradiation. Since phosphorus diffuses into the channel forming region to some extent during the annealing process, the boundary between the channel forming region 18 and the source/drain regions 17 and 19 is shifted nearer to the channel forming region 18 from the outer side of the oxide layer 16.

Figure 5B:
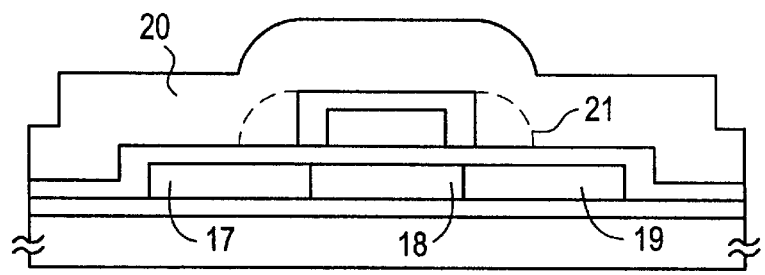
Figure 5C:
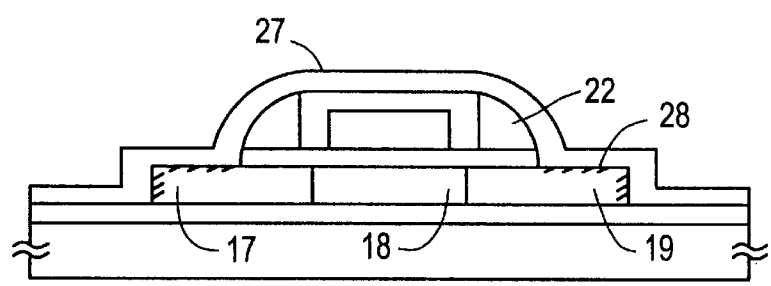

A silicon oxide film 20 was then deposited to a thickness of from 2,000 Å to 2 μm, specifically 9,000 Å in the present example by sputtering. The silicon oxide film 20 can be deposited otherwise by plasma CVD using TEOS and oxygen. The resulting silicon oxide film on the upper portion of the gate contact 15 having a large step difference is shown in FIG. 5(B). However, this is shown qualitatively and varies depending on the step coverage and the film thickness of the silicon oxide film 20.

The resulting silicon oxide film 20 was then subjected to etching using a known anisotropic etching, i.e., a RIE (reactive ion etching) process. Since the thickness on the sides of the gate contact 15 having a height of 9,000 Å results approximately twice the film thickness (i.e., the film thickness of the silicon oxide film, 9,000 Å), the residual silicon oxide results in a shape outlined by broken lines 21 in the figure. The silicon oxide gate insulator film 14 was etched continuously to expose the source/drain regions 17 and 19. A step can be found to form on the edge portions of the crystalline silicon film 13 having patterned as an active layer. However, since this step is merely about 1,000 Å in height, substantially no silicon oxide film 20 remains on this portion. In the embodiment illustrated in FIG. 5, silicon oxide remains in a shape outlined by broken lines 21 because the silicon oxide film 20 was left over in a shape shown in FIG. 5(B). However, if the silicon oxide film 20 were to be deposited in a shape reflecting the shape of the gate contact (as a rectangular protrusion), the shape illustrated by the broken lines results in a rectangular or an angular shape.

Thus, silicon oxide 22 shaped approximately into a triangular shape can be obtained. The width of the triangular silicon oxide 22 in this embodiment is about 3,000 Å, but in practice, the width is determined depending on the film thickness of the silicon oxide film 20 and the etching conditions, further taking the height of the gate contact 15 (inclusive of the oxide layer 16) into consideration.

Subsequently thereafter, a Ti or a $TiSi_2$ film was deposited and subjected to thermal annealing to obtain a silicide 28 of Ti. In the present example, the Ti film was deposited to a thickness of 500 Å by sputtering, and in general, it is deposited to thickness in the range of from 100 Å to 1,000 Å. The resulting film was annealed at 450° C. to obtain the silicide layer 28. The annealing can be effected by lamp annealing employing an infrared light. Lamp annealing is effected as such that the irradiated surface may be heated to a temperature range of from 600 to 1,000° C. If the annealing is effected at 600° C., the duration thereof is for several minutes. If the annealing is effected at a higher temperature of 1,000° C., the duration is then several seconds. In the present example, the thermal annealing after depositing the Ti film was effected at 450° C. because the gate contact was made of aluminum. However, if a gate contact containing silicon as the principal component were to be used, an annealing at a temperature not lower than 500° C. is preferred.

The Ti film was then etched using an etching solution containing a 5:2:2 mixture of hydrogen peroxide, ammonia, and water. The titanium silicide layer 28 remaining unetched was annealed by irradiating thereto a laser beam at an output energy of from 200 to 400 $mJ/cm^2$.

Figure 5D:
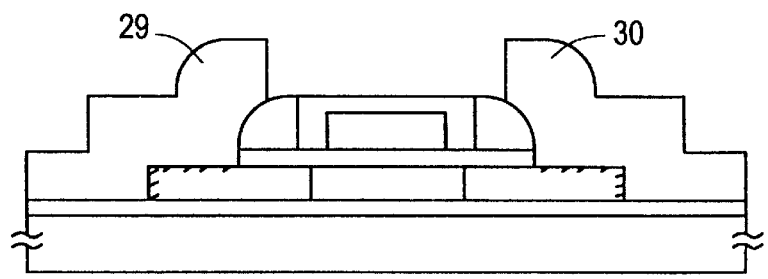

Thus, a Ti silicide 28 was formed on the surface of the source/drain regions, and an NTFT shown in FIG. 5(D) was obtained by forming further thereon source/drain contacts 29 and 30.

Preferably, the source/drain contacts 29 and 30 are formed from a Ti nitride/aluminum bilayer film comprising a titanium nitride base film and an aluminum layer thereon. In this manner, an extremely favorable contact can be established because the surface of the source/drain regions are made of titanium silicide.

The NTFT thus obtained comprises a triangular silicon oxide 22 to establish a contact portion between the source/drain regions and the contact in a so-called self-aligned manner. Moreover, the position of the contact portion can be set irrespective of the shrinking of the glass substrate 11. Furthermore, the contact portion can be set very near to the channel forming region. More advantageously, the sheet resistance of the source/drain regions is reduced by incorporating the silicide layer 28. In this manner, a high-performance TFT can be obtained. In addition, since the step of perforating the gate insulator film for establishing the source/drain contacts can be eliminated, problems associated with this step can be circumvented.

Further advantage according to the present embodiment is the presence of the anodically oxidized aluminum oxide ($Al_2O_3$) and silicon oxide ($SiO_2$) 22 on the sides of the gate contact 15. The parasitic capacitance between the gate contact and the source/drain contacts can be reduced.

EXAMPLE 6

Referring to FIG. 6, the process of fabricating a N-channel TFT (NTFT) according to an embodiment of the present invention is described below. The portions in FIG. 6 that are indicated with the same symbols in FIG. 5 were fabricated in the same manner as in Example 5.

First, a 2,000 Å thick silicon oxide film was deposited on a glass substrate 11 by sputtering. Then, a 1,000 Å thick amorphous silicon film 13 was deposited thereon by plasma CVD. The amorphous silicon film 13 thus obtained was thermally annealed at 600° C. for 24 hours for crystallization to obtain a crystalline silicon film.

Figure 6A:
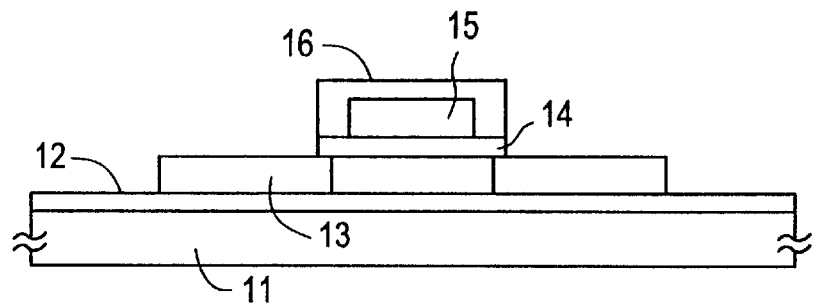
FIGS. 6(A) to 6(D) show a step sequential process for fabricating another TFT of another Example according to the present invention.
Figure 6B:
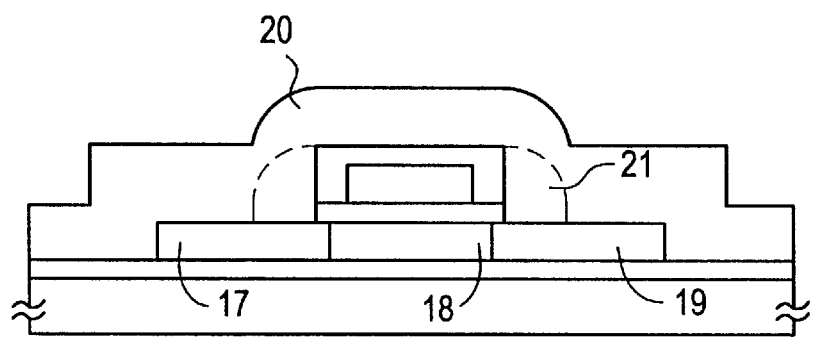
Figure 6C:
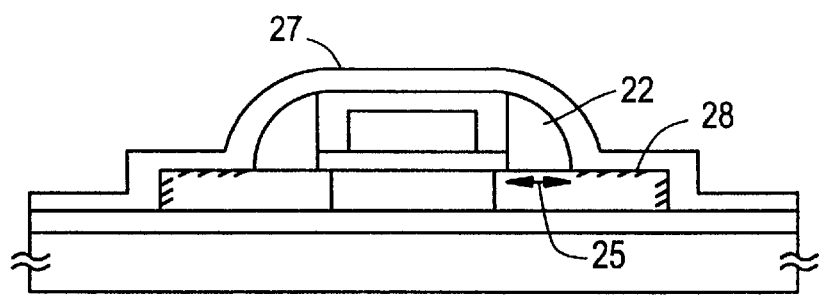
Figure 6D:
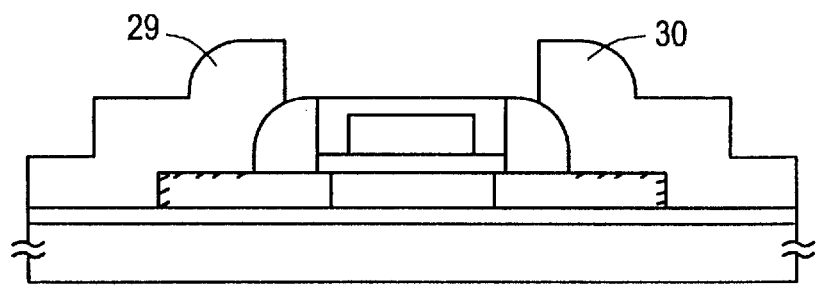
Figure 7A:
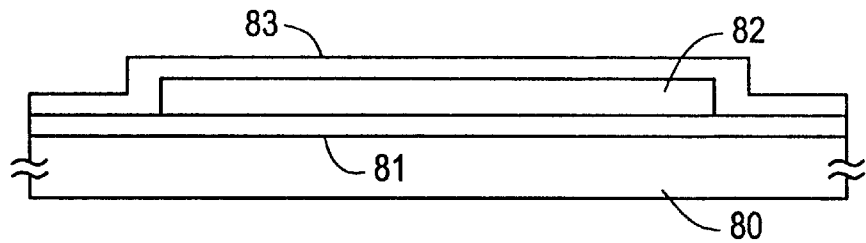
FIGS. 7(A) to 7(D) show a step sequential process for fabricating another TFT of still another Example according to the present invention.
Figure 7B:
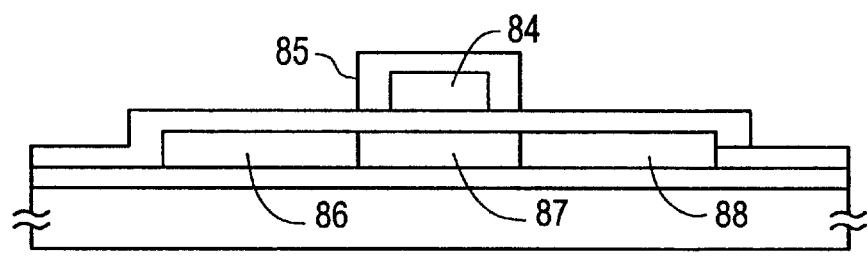
Figure 7C:
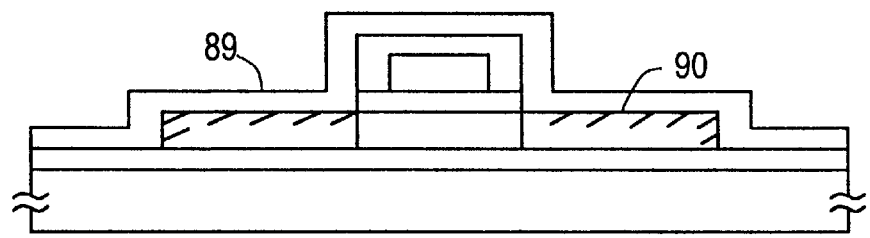
Figure 7D:
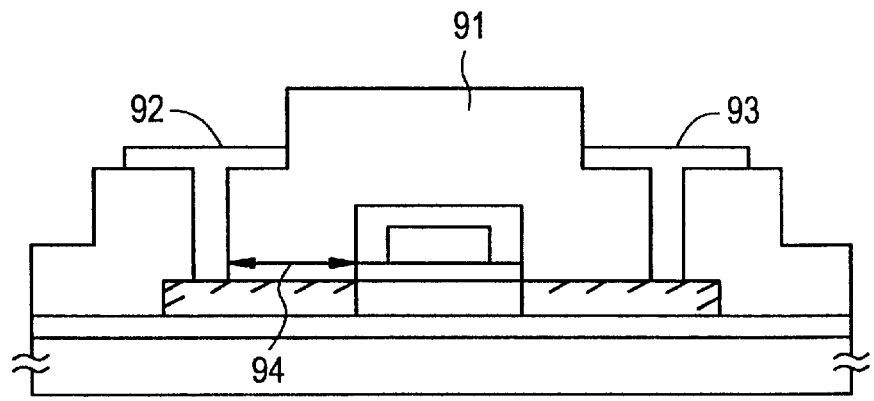
Figure 8A:
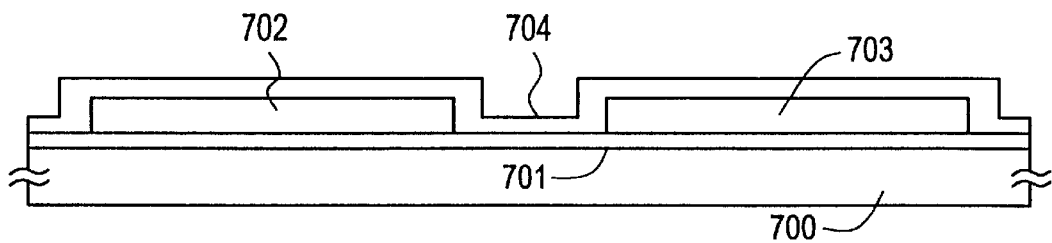
FIGS. 8(A) to 8(D) show a step sequential process for fabricating another TFT of yet another Example according to the present invention.
Figure 8B:
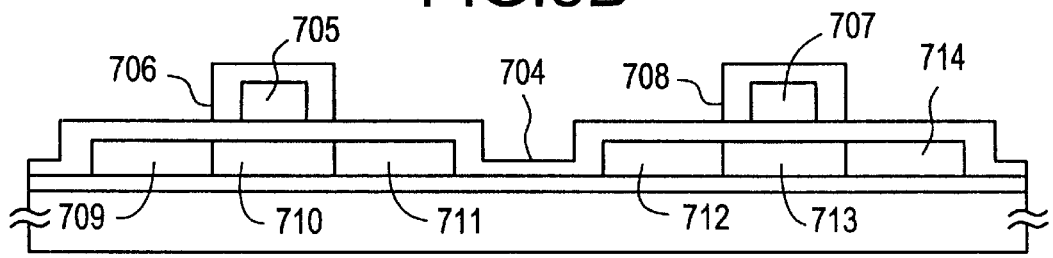
Figure 8C:
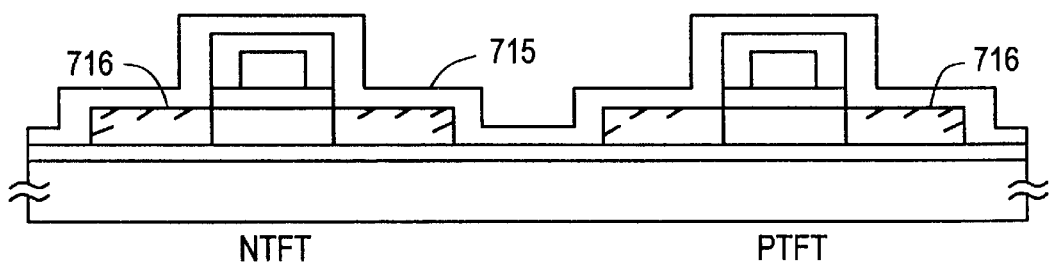
Figure 8D:
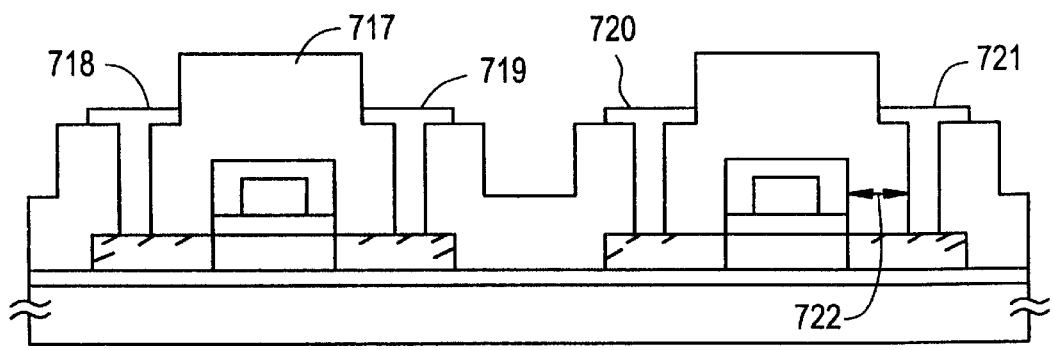
Figure 9A:
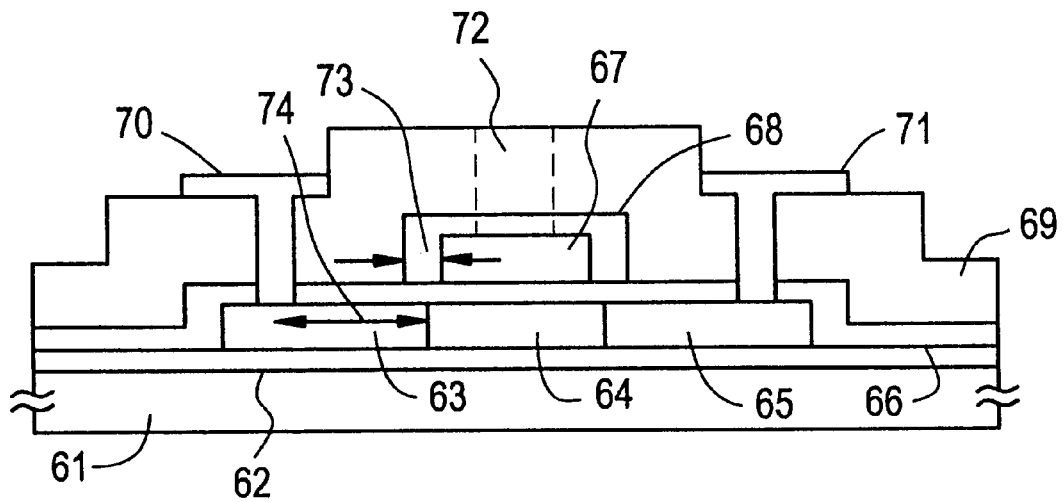
FIGS. 9(A) and 9(B) show structures of prior art TFTs.
Figure 9B:
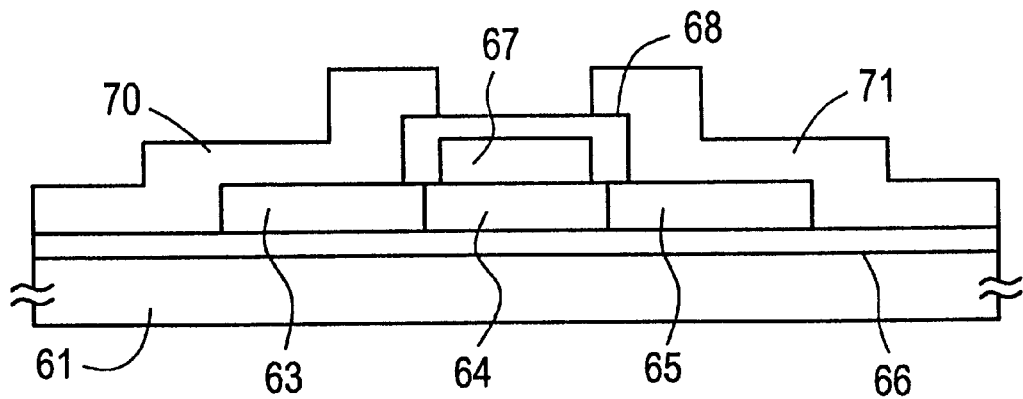

A 6,000 Å thick aluminum film was deposited and subjected to process steps similar to those performed in Example 5 to obtain an aluminum gate contact 15 having on the surface thereof a 2,000 Å thick oxide layer 16. The gate insulator film 14 was removed by etching except for the gate contact to obtain a structure as shown in FIG. 6(A). Source/drain regions 17 and 19, and also a channel forming region 18 were formed thereafter in a self aligned manner by implanting phosphorus ions. The ion implantation step can be effected before removing the silicon oxide gate insulator film 14. The source/drain regions 17 and 19 are activated thereafter by irradiation of a laser beam, lamp heating, or thermal annealing.

A 6,000 Å thick silicon oxide film 20 was deposited by sputtering, and etching was performed in the same way as in Example 5 to obtain a triangular silicon oxide 22 on the portion indicated with 21.

A titanium film 27 was deposited to a thickness of 500 Å. Then, after thermally annealing at 450° C., the titanium film 27 was removed by selective etching following the process described in Example 5. Annealing was conducted by further irradiating a laser beam to the film to form a titanium silicide layer 28. An NTFT was completed thereafter by forming aluminum contacts corresponding to source/drain contacts 29 and 30.

The NTFT according to the present embodiment provides from its unique structure, effects similar to those obtained on the TFT of Example 5. Because the width 25 of the triangular silicon oxide 22 can be reduced to about 3,000 Å, not only a favorable contact can be obtained between the source/drain regions 17 and 19 and the contacts 29 and 30, but also the contact portion of the source/drain regions 17 and 19 can be formed at a position as near as possible to the channel forming region 18. Accordingly, a high performance TFT can be implemented.

The dimension of the portion 25 is determined according to requirements depending on the film thickness of the silicon oxide film 20, the etching conditions of the silicon oxide film 20, and the height of the gate contact 15 inclusive of the oxide layer 16.

Since the step of perforation to the source/drain regions can be eliminated, problems associated with this step can be fundamentally circumvented.

EXAMPLE 7

Referring to FIG. 7, a process of fabricating a TFT according to an embodiment of the present invention is described below. The present example is characterized in that the source/drain contacts of the TFT according to the present embodiment are formed by a process similar to that of a prior art, but that a silicide layer is formed on the surface 90 of the source/drain regions to reduce the sheet resistance of the source/drain regions 86 and 88.

First, a 1,000 Å thick silicon oxide film was deposited as a base film 81 on a glass substrate 80 by sputtering. Then, a 1,000 Å thick amorphous silicon film 82 was deposited thereon by plasma CVD. The amorphous silicon film 82 thus obtained was thermally annealed at 600° C. for 48 hours for crystallization, and was subjected to element isolation to form an active layer.

A 1,000 Å thick silicon oxide film 83 was deposited as a gate insulator film by sputtering. Then, an aluminum film containing 1% silicon was deposited to a thickness of 6,000 Å to give a gate contact 84 by patterning. Then, a 2,000 Å thick oxide layer 85 was formed by anodic oxidation. The source/drain regions 86 and 88 were rendered N-type conductive by implanting phosphorus ions, and a channel forming region 87 was formed in a self aligned manner. Thus were obtained source/drain regions 86 and 88, and a channel forming region 87.

The source/drain regions were activated by irradiating a laser beam or an infrared light. The resulting exposed silicon oxide film 83 was removed, and a titanium film 89 was formed to a thickness of 500 Å by sputtering. A titanium silicide layer 90 was formed by annealing the thus deposited titanium film at 450° C. The titanium film 89 was removed thereafter by selective etching as explained in Example 5. The resulting structure was further annealed by laser irradiation.

An interlayer insulator 91 was formed from silicon oxide and then subjected to an ordinary patterning step to form source/drain contacts 92 and 93. By adopting the constitution according to the present embodiment, a TFT free from being influenced by the sheet resistance of the source/drain regions can be obtained. That is, the TFT according to the present embodiment comprises source/drain contacts 92 and 93 being located at a distance 94 from the channel forming region 87, but with a sheet resistance of the source/drain regions being lowered by the presence of the silicide layer 90. Moreover, the distance 94 can be taken with some allowance. This allows mask matching to be conducted also with allowance in the later step of perforating the interlayer insulator 91 for forming the source/drain regions. It can be seen that the structure according to the present invention is advantageous from the viewpoint of implementing the process steps.

In the perforation of a hole to the gate contact at the same time with the perforation of contact holes connected to the source/drain regions, a problem of the upper surface modification of the source/drain regions by the etching solution (a buffer hydrofluoric acid) had been recognized in a prior art processes. In the process according to the present embodiment, however, the above problem can be circumvented because the silicide layer on the upper surface of the source/drain region remains unetched by the buffer hydrofluoric acid.

EXAMPLE 8

Referring to FIG. 8, a process of fabricating a complementary TFT (C/TFT) comprising an N-channel TFT (NTFT) and a P-channel TFT (PTFT) in a complementary structure according to an embodiment of the present invention is described below.

First, a 1,000 Å thick silicon oxide film was deposited as a base film 701 on a glass substrate 700 by sputtering. Then, a 1,000 Å thick amorphous silicon film was deposited thereon by plasma CVD. The amorphous silicon film thus obtained was thermally annealed at 600° C. for 48 hours for crystallization, and was subjected to element isolation to form crystallized active layers 702 and 703.

A 1,000 Å thick silicon oxide film 704 was deposited as a gate insulator film by sputtering. Then, an aluminum film containing 1% silicon was deposited to a thickness of 6,000 Å to give a gate contacts 705 and 707 by patterning. Subsequently, 2,000 Å thick oxide layers 706 and 708 were formed by anodic oxidation. The source/drain regions 709 and 711 were rendered P-type conductive by implanting boron ions, and a channel forming region 710 was formed in a self aligned manner. By further implanting phosphorus ions into the other active layer 703, the source/drain regions 712 and 714 were rendered N-type conductive, and a channel forming region 713 was formed again in a self aligned manner. If ion implantation is unnecessary in this step, the region can be covered with a resist.

The source/drain regions were activated by irradiating a laser beam or an infrared light. The resulting exposed silicon oxide film 704 was removed, and a titanium film was deposited under conditions similar to those described in Example 5. A titanium silicide layer 716 was formed by annealing the thus deposited titanium film. The titanium film was removed thereafter by selective etching as explained in Example 5, followed by annealing using laser irradiation. In this manner, a titanium silicide layer 716 was obtained.

An interlayer insulator 717 was formed from silicon oxide and then subjected to an ordinary patterning step to form source/drain contacts 718 and 719 for the PTFT and the same 720 and 721 for the NTFT. By adopting the constitution according to the present embodiment, an NTFT free from being influenced by the sheet resistance of the source/drain regions can be obtained. That is, the NTFT according to the present embodiment comprises source/drain contacts 720 and 721 being located at a distance 722 from the channel forming region 713, but with a sheet resistance of the source/drain regions being lowered by the presence of the silicide layer 716. Moreover, the distance 722 can be taken with some allowance. This allows mask matching to be conducted also with allowance in the later step of perforating the interlayer insulator 717 for forming the source/drain regions. It can be seen that the structure according to the present invention is advantageous from the viewpoint of implementing the process steps, and that the surface of the source/drain regions can be prevented from being modified or etched during the perforating step.

In the structures described in the Examples 5 to 8 above, aluminum was used as the gate contact, and an oxide layer was formed around the gate contact by anodic oxidation. However, the gate contact may be such containing silicon or a metal as the principal component. Otherwise, it may be made from a laminate of a semiconductor and a metal, or a silicide of a metal and a semiconductor. More specifically, contacts of metals such as titanium, chromium, and tantalum, of a laminate thereof with silicon, or of a silicide with those metals may be used as the gate contact as well as those of a laminate or a silicide of Si—W, Si—Mo, and Si—Al.

EXAMPLE 9

Referring to FIG. 10, a process for fabricating a TFT according to an embodiment of the present invention is described below. A 100 to 300 nm thick silicon oxide film 1102 was deposited by sputtering in oxygen atmosphere as a base oxide film on a Corning 7059 substrate 1101 (300 mm×400 mm in size or 100 mm×100 mm in size). As a process more suited for mass production, however, the base oxide film may be formed by decomposing and depositing TEOS (tetraethoxysilane) using plasma CVD, and annealing the resulting film at a temperature in the range of from 450 to 650° C.

Then, an amorphous silicon film was deposited by plasma CVD or LPCVD to a thickness of from 30 to 500 nm, preferably from 50 to 100 nm, and was allowed to stand in a reducing atmosphere for 24 hours at a temperature of from 550 to 600° C. to effect crystallization. This step may be performed by laser irradiation. The resulting crystallized silicon film was patterned to give island-like portions. A silicon oxide film 1105 was further deposited thereon at a thickness of from 70 to 150 nm by sputtering.

An aluminum film containing 99% Al and 1% Si was formed thereafter at a thickness of from 200 nm to 5 µm by electron beam deposition, and was patterned to obtain a gate contact 1106. The resulting gate contact was anodically oxidized in an electrolytic solution by applying current thereto. Thus was obtained a 50 to 250 nm thick anodic oxide 1107. The anodic oxidation was performed under the conditions disclosed in Japanese patent application Hei-4-30220 (filed on Jan. 21, 1992).

Impurities were introduced into the island-like silicon film on each of the TFTs in a self-aligned manner by ion doping process using the gate contact portion (i.e., the gate contact and the surrounding anodic oxide film) as the mask to obtain source/drain regions (impurity region) 1103 as shown in FIG. 10(A). The impurity region can be formed by implanting phosphorus using phosphine ($PH_3$) as the doping gas in the case of forming an NMOS TFT, and by implanting boron using diborane ($B_2H_6$) as the doping gas to obtain a PMOS TFT. The ion doping was performed at an accelerating energy of from 10 to 90 keV, and an ion dose of $2\times10^{14}$ to $8\times10^{14}$ $cm^{-2}$.

A silicon oxide film 1108 was deposited to a thickness of from 400 nm to 1.5 µm, for example, to a thickness of 900 nm, by plasma CVD.

The resulting silicon oxide film 1108 was then subjected to etching using a known anisotropic etching, i.e., a RIE process. The thickness on the sides of the gate contact 1106 having a height of 900 nm results approximately twice the film thickness (i.e., the film thickness of the silicon oxide film, 900 nm) in this case. A continuous etching of the silicon oxide gate insulator film 1105 provides exposed source/drain regions 1103. After the steps above, a triangular insulator 1109 results on the sides of the gate contact as shown in FIG. 10(C).

A 5 to 50 nm thick tungsten film 1110 was deposited by sputtering to obtain a structure shown in FIG. 10(D). Subsequently thereafter, the deposited tungsten film was allowed to react with silicon by irradiating thereto a KrF excimer laser operating at a wavelength of 248 nm and at a pulse width of 20 nsec. Thus was obtained a tungsten silicide region 1111 on the impurity region (source/drain). An appropriate laser treatment could be performed by operating the laser at an energy density of from 200 to 400 $mJ/cm^2$, preferably at an energy density of from 250 to 300 $mJ/cm^2$. The thus irradiated laser beam was mostly absorbed by the tungsten film and was therefore hardly used for the recovery of crystallinity of the impurity region in silicon which had been seriously damaged in the precedent ion doping step.

However, since tungsten silicide has such a low resistivity in the range of from 30 to 100 µΩ·cm, the substantial sheet resistance of the source and drain regions (the region 1108 and the impurity region under the region 1108) was found to be 10 $\Omega/cm^2$ or lower. As a matter of course, the impurity region can be relieved of degradation by subjecting it to laser irradiation or thermal annealing, etc., immediately after the ion implantation step.

The tungsten film which remained unreacted through the irradiation of laser was removed by etching as shown in FIG. 10(E) to leave over only tungsten silicide. Tungsten can be removed, for example, as tungsten hexafluoride gas by subjecting it to reactive etching in a carbon fluoride atmosphere.

Finally, a silicon oxide film was deposited to a thickness of 300 nm by CVD to provide an interlayer insulator 1112 on the entire surface of the resulting structure. After perforating contact holes for the source/drain of the TFT, aluminum connections with contacts 1113 were formed. In this manner, the structure was completed into a TFT. Furthermore, hydrogen annealing in the temperature range of from 200 to 400° C. can be performed to activate the impurity region.

EXAMPLE 10

Referring to FIG. 11, a process for fabricating a TFT according to an embodiment of the present invention is described below. A base oxide film 1202, an island like semiconductor region, a silicon oxide film which functions as a gate oxide film 1205, and an aluminum film from 200 nm to 5 µm in thickness as a gate contact 1206 were formed on a Corning 7059 substrate 1201 sequentially in the same manner as in Example 9 above. Then, an anodic oxide 1207 was formed on the periphery (the sides and the upper surface) of the gate contact by anodic oxidation following the same procedure as in Example 9. An impurity region 1203 was formed by implanting impurities at a dose of $1\times10^{14}$ to $5\times10^{14}$ $cm^{-3}$, using ion doping employing the gate contact as the mask.

Subsequently, the doped impurities were activated by irradiating thereto a KrF excimer laser operating at a wavelength of 248 nm and at a pulse width of 20 nsec. An appropriate laser treatment was found to be obtained by operating the laser at an energy density of from 200 to 400 $mJ/cm^2$, preferably at an energy density of from 250 to 300 $mJ/cm^2$. Thus was obtained a structure shown in FIG. 11(A).

The activation may be performed by irradiating infrared light using a lamp, or by using a known annealing process of heating. Best preferred and most useful as the activation process is, however, using an infrared light (e.g., a light 1.2 µm in wavelength), because infrared light can be selectively absorbed by the silicon semiconductor without considerably heating the glass substrate. Moreover, heating up of the glass substrate can be prevented by shortening the duration of irradiation. Subsequent to the activation step above, the gate oxide film was etched by dry etching using the anodic oxide 1207 as the mask. Preferably, for instance, $CF_4$ gas is used as the etching gas because the anodic oxide can be left unetched while etching the silicon oxide gate insulator film 1205 alone. A silicon oxide film 1208 was deposited subsequent thereto to a thickness of from 400 nm to 1.5 µm by plasma CVD.

A triangular insulator 1209 of silicon oxide was formed on the sides of the gate contact by anisotropic etching in the same manner as in Example 9 above. A 5 to 50 nm thick titanium film 1210 was formed by sputtering as shown in FIG. 11(C). The titanium film was heated to a range of from 250 to 650° C. to allow titanium react with silicon to thereby form a titanium silicide region 1211 to a surface of the insulating substrate (including the base oxide film 1202) on the impurity region (source/drain). This step is preferably performed at such a temperature that hillock would not generate on the gate contact and the like.

It is necessary to provide a junction of N+ and the substrate under the silicide region in case of an IC of a single crystal semiconductor substrate. However, since the present invention utilizes a thin film IC provided on an insulating substrate, the silicide can be provided in direct contact with the glass substrate (insulating substrate). Hence, the formation of the silicide can easily be carried out.

The annealing in the present example can be effected by lamp annealing using an infrared light. Lamp annealing is effected as such that the irradiated surface may be heated to a temperature range of from about 600 to 1,000° C. If the annealing should be effected at 600° C., the duration thereof is for several minutes. If the annealing is effected at a higher temperature of 1,000° C., the duration is then several seconds. In the present example, the thermal annealing after depositing the titanium film was effected at 650° C. or lower because the gate contact was made of aluminum. However, if a gate contact containing silicon as the principal component were to be used, an annealing at a temperature of 700° C. or higher is preferred.

The titanium film was then etched using an etching solution containing a 5:2:2 mixture of hydrogen peroxide, ammonia, and water. The titanium silicide layer 1211 remains unetched. Finally, as shown in FIG. 11(E), a silicon oxide film was deposited to a thickness of 300 nm by CVD to provide an interlayer insulator 1212 on the entire surface of the resulting structure. After perforating contact holes for the source/drain of the TFT, aluminum connections with contacts 1213 were formed. In this manner, a complete TFT was obtained.

EXAMPLE 11

Referring to FIG. 13, a process for fabricating an active-matrix addressed liquid crystal display substrate is described below.

Figure 13A:
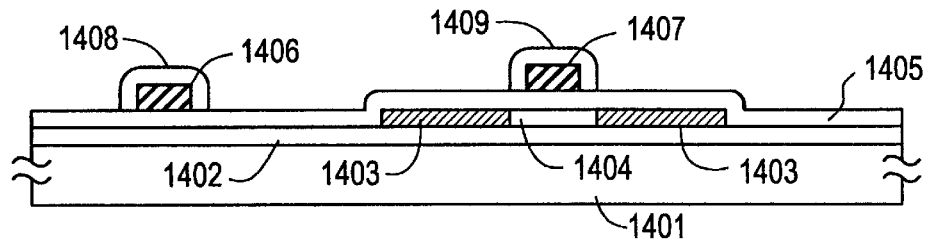
FIGS. 13(A) to 13(E) show a step sequential process for fabricating an active matrix substrate.

Referring to FIG. 13(A), a base oxide film 1402, an island like semiconductor region, and a silicon oxide film which functions as a gate oxide film 1405 were formed on a Corning 7059 substrate 1401 sequentially in the same manner as in Example 9 above, and an aluminum film from 200 nm to 5 $\mu$m in thickness as a gate contact 1407 together with a connection (a first layer connection) 1406 in the same layer were further formed thereafter. Then, an anodic oxide 1408 was formed on the periphery (the sides and the upper surface) of the gate contact by anodic oxidation following the same procedure as in Example 9. An impurity region 1403 was formed by implanting impurities using ion doping. Subsequently, the doped impurities were activated by irradiating thereto a KrF excimer laser operating at a wavelength of 248 nm and at a pulse width of 20 nsec. An appropriate laser treatment was found to be obtained by operating the laser at an energy density of from 200 to 400 mJ/cm², preferably at an energy density of from 250 to 300 mJ/cm².

Figure 13B:
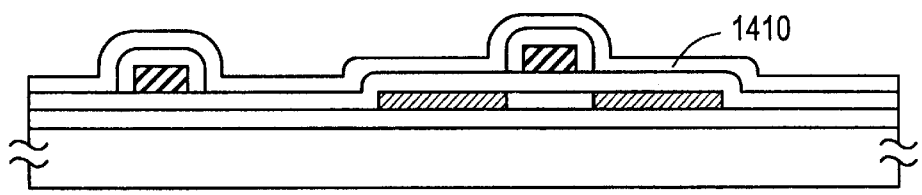

Then, a silicon oxide film 1410 was deposited as shown in FIG. 13(B). Triangular insulators 1411 and 1412 were formed on the sides of the gate contact and the first layer connection by anisotropic etching in the same manner as in Example 9 above. After exposing source/drain regions, a 5 to 50 nm thick titanium film was formed by sputtering. The substrate temperature during the film deposition was maintained in a range of from 250 to 450° C., preferably from 200 to 300° C., to allow titanium react with silicon to thereby form a titanium silicide layer 1413 on the surface of the source/drain region.

Figure 13C:
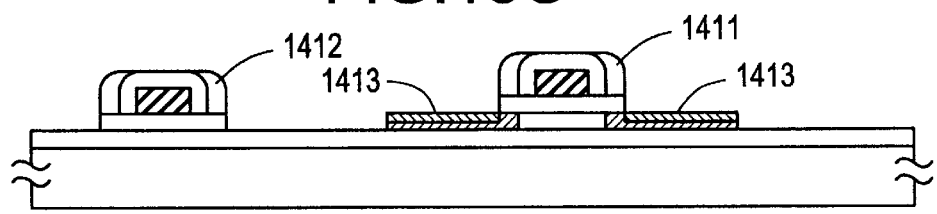
Figure 13D:
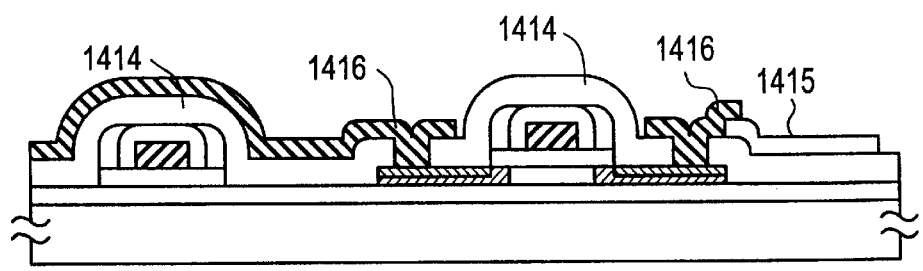

Then, as shown in FIG. 13(C), the titanium film remained unreacted was etched, and a 600 nm thick silicon oxide film was deposited by CVD as an interlayer insulator 1414 on the entire surface. This step was followed by depositing an ITO film to a thickness of from 50 to 100 nm by sputtering. The ITO film was then patterned to provide a pixel electrode 1415. Finally, contact holes for the source/drain of the TFT were formed, and a multilayered film of aluminum and titanium nitride was deposited and patterned to obtain connections with contacts 1416 for the second layer. The thickness of titanium nitride and aluminum layers was 80 nm and 500 nm, respectively. In this manner, a complete active-matrix addressed substrate was obtained.

Figure 13E:
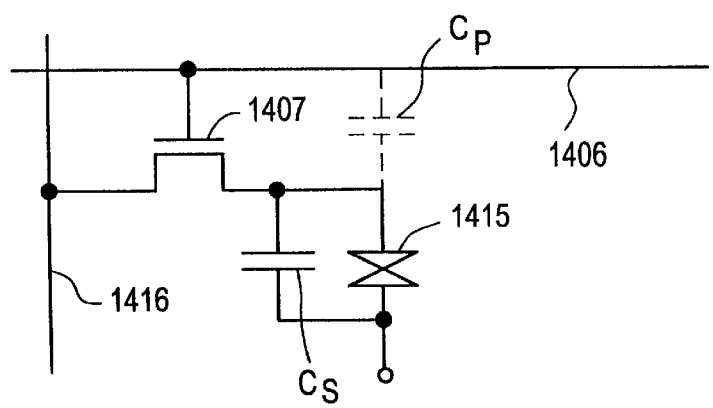

Among the active matrix fabricated by the present example, a circuit for a single pixel is shown in FIG. 13(E). The sheet resistance between the source/drain contacts 1416 and the gate contact 1407 casts no problem even when a large distance is taken therebetween. Furthermore, since the gate contact is provided as an offset gate, the parasitic capacitance $C_p$ between the gate contact and the source/drain regions (or the source/drain contacts) is found to be sufficiently small. It can be seen that an ideal active matrix is obtained. Thus, a sustaining capacitance $C_s$ which is generally fabricated in parallel connection with the pixel capacitance can be considerably reduced, or completely eliminated. Accordingly, an increased aperture ratio can be achieved.

A peripheral driver circuit for an active matrix can be fabricated using the TFT according to the present embodiment by reducing the thickness of the anodic oxide 1409 as compared to the embodiment (a pixel TFT) described above. Otherwise, the anodic oxide can be completely eliminated. A pixel TFT requires that the parasitic capacitance $C_p$ is minimized, but a TFT for the peripheral circuit does not strictly require the reduction of $C_p$.

As described in the foregoing, the present invention provides a thin film semiconductor device having a substantially reduced resistance between the source and the drain. A prior art process required a thermal annealing to be conducted for a long period of time to lower the resistance between the source and the drain. However, such prior art processes suffered disadvantages of low throughput, and, the substrate materials applicable to the processes were confined to such resistant to a temperature of 550° C. or even higher. A process using laser radiation had also been proposed, however, the process required optimization of the energy density. Under an energy density lower or higher than the proper value, no favorable sheet resistance could be obtained. Accordingly, such process resulted in TFTs having largely scattered characteristic values, and, moreover, only a sheet resistance of several hundreds of ohms per square ($\Omega/cm^2$) at best could be obtained.

In contrast to the above prior art processes, the preset invention provides a thin film semiconductor device having a sheet resistance typically reduced to 100 $\Omega/cm^2$ or even lower, because a very thin silicide film is formed on the surface of the silicon semiconductor (source/drain) to considerably lower the sheet resistance. The present invention requires laser irradiation to obtain the silicide film, however, the operating conditions need not be strictly controlled as in the prior art processes for activating silicon. Moreover, the laser irradiation considerably improves the product yield. The process for fabricating the silicide film also requires the deposition of a metal film, however, the process time for the film deposition is as short as to make the entire process feasible for mass production.

Furthermore, with respect to the silicon semiconductor impurity region under the silicide layer, the activation step for recovering crystallinity from the damage of ion implantation not necessary be conducted. For instance, after implanting impurities at a dose of $10^{15}$ cm$^{-2}$ or more using ion doping, a sheet resistance of about 10 k$\Omega$/cm$^2$ can be obtained without subjecting the impurity region to an activation process. Accordingly, in a practical device according to the present invention provided with a low resistance silicide layer in contact with the impurity region, the substantial sheet resistance of the source and the drain is sufficiently low.

However, numerous defects may be present in a silicon semiconductor not subjected to an activation step, and such silicon semiconductors are sometimes unfavorable from the viewpoint of reliability. In such cases, the activation of the impurity region must be performed. It should be noted that the incorporation of the activation step increases the steps of the entire process. However, the use of laser irradiation with the purpose of activation considerably reduces the process duration without complicating the process, because this step can be performed under a less strict conditions as compared to the case using laser irradiation in optimally controlling the sheet resistance of the impurity region.

As described in the foregoing, the present invention is of great use in fabricating TFTs with improved characteristics and yet, with increased product yield.

In addition to above, the position of the contact in the source/drain regions can be automatically set by providing the insulator in contact with the gate contact in a self aligned manner. Further advantage is that a structure without making special consideration of the sheet resistance of the source/drain regions can be obtained. In particular, devices free of mask matching and problems associated with the formation of contact holes can be obtained while setting the distance between the contact portion and the channel forming region in a self aligned manner.

A thin film semiconductor device can be fabricated with further improved device characteristics, reliability, and productivity, yet with an increased product yield by forming a silicide layer on the surface of the source/drain regions, thereby lowering the sheet resistance of the source/drain regions.

While the invention has been described in detail and with reference to specific embodiments thereof, it will be apparent to one skilled in the art that various changes and modifications can be made therein without departing from the spirit and scope thereof.

What is claimed is:

1. A method of manufacturing a semiconductor device comprising the steps of:

forming a semiconductor film over a substrate;

forming a gate insulating film by using organic silane over said semiconductor film, said gate insulating film comprising silicon oxide;

forming a gate electrode over said gate insulating film, said gate electrode comprising aluminum;

introducing an impurity element into said semiconductor film; and activating said impurity element in said semiconductor film by irradiating an infrared light.

2. A method according to claim 1, wherein said impurity element is phosphorus.

3. A method according to claim 1, wherein said organic silane is TEOS.

4. A method according to claim 1, wherein said semiconductor device is incorporated into a device selected from the group consisting of a liquid crystal display device, a SOI integrated circuit, a microprocessors, a microcomputer and a semiconductor memory.

5. A method of manufacturing a semiconductor device comprising the steps of:

forming a semiconductor film over a substrate;

crystallizing said semiconductor film by heating forming a gate insulating film by using organic silane over said crystalline semiconductor film, said gate insulating film comprising silicon oxide;

forming a gate electrode over said gate insulating film, said gate electrode comprising aluminum;

introducing an impurity element into said crystalline semiconductor film; and activating said impurity element in said crystalline semiconductor film by irradiating an infrared light.

6. A method according to claim 5, wherein said impurity element is phosphorus.

7. A method according to claim 5, wherein said organic silane is TEOS.

8. A method according to claim 5, wherein said semiconductor device is incorporated into a device selected from the group consisting of a liquid crystal display device, a SOI integrated circuit, a microprocessors, a microcomputer and a semiconductor memory.

9. A method of manufacturing a semiconductor device comprising the steps of:

forming a semiconductor film over a substrate;

crystallizing said semiconductor film by irradiating a light;

forming a gate insulating film by using organic silane over said crystalline semiconductor film, said gate insulating film comprising silicon oxide;

forming a gate electrode over said gate insulating film, said gate electrode comprising aluminum;

introducing an impurity element into said crystalline semiconductor film; and activating said impurity element in said crystalline semiconductor film by irradiating an infrared light.

10. A method according to claim 9, wherein said impurity element is phosphorus.

11. A method according to claim 9, wherein said organic silane is TEOS.

12. A method according to claim 9, wherein said semiconductor device is incorporated into a device selected from the group consisting of a liquid crystal display device, a SOI integrated circuit, a microprocessors, a microcomputer and a semiconductor memory.

13. A method of manufacturing a semiconductor device comprising the steps of:

forming a semiconductor film over a substrate;

forming a gate insulating film by using organic silane over said semiconductor film, said gate insulating film comprising silicon oxide;

forming a gate electrode over said gate insulating film, said gate electrode comprising aluminum;

introducing an impurity element into said semiconductor film; and activating said impurity element in said semiconductor film by irradiating a laser light.

14. A method according to claim 13, wherein said impurity element is phosphorus.

15. A method according to claim 13, wherein said organic silane is TEOS.

16. A method according to claim 13, wherein said semiconductor device is incorporated into a device selected from the group consisting of a liquid crystal display device, a SOI integrated circuit, a microprocessors, a microcomputer and a semiconductor memory.

17. A method of manufacturing a semiconductor device comprising the steps of:

forming a semiconductor film over a substrate;

crystallizing said semiconductor film by heating forming a gate insulating film by using organic silane over said crystalline semiconductor film, said gate insulating film comprising silicon oxide;

forming a gate electrode over said gate insulating film, said gate electrode comprising aluminum;

introducing an impurity element into said crystalline semiconductor film; and activating said impurity element in said crystalline semiconductor film by irradiating a laser light.

18. A method according to claim 17, wherein said impurity element is phosphorus.

19. A method according to claim 17, wherein said organic silane is TEOS.

20. A method according to claim 17, wherein said semiconductor device is incorporated into a device selected from the group consisting of a liquid crystal display device, a SOI integrated circuit, a microprocessors, a microcomputer and a semiconductor memory.

21. A method of manufacturing a semiconductor device comprising the steps of:

forming a semiconductor film over a substrate;

crystallizing said semiconductor film by irradiating a light;

forming a gate insulating film by using organic silane over said crystalline semiconductor film, said gate insulating film comprising silicon oxide;

forming a gate electrode over said gate insulating film, said gate electrode comprising aluminum;

introducing an impurity element into said crystalline semiconductor film; and activating said impurity element in said crystalline semiconductor film by irradiating a laser light.

22. A method according to claim 21, wherein said impurity element is phosphorus.

23. A method according to claim 21, wherein said organic silane is TEOS.

24. A method according to claim 21, wherein said semiconductor device is incorporated into a device selected from the group consisting of a liquid crystal display device, a SOI integrated circuit, a microprocessors, a microcomputer and a semiconductor memory.

* * * * *